(12) United States Patent
Zinn

(10) Patent No.: US 11,735,548 B2
(45) Date of Patent: Aug. 22, 2023

(54) ELECTRONICS ASSEMBLIES EMPLOYING COPPER IN MULTIPLE LOCATIONS

(71) Applicant: Kuprion Inc., San Jose, CA (US)

(72) Inventor: Alfred A. Zinn, Palo Alto, CA (US)

(73) Assignee: Kuprion Inc., San Jose, CA (US)

( * ) Notice: Subject to any disclaimer, the term of this patent is extended or adjusted under 35 U.S.C. 154(b) by 101 days.

(21) Appl. No.: 17/266,749

(22) PCT Filed: Aug. 8, 2019

(86) PCT No.: PCT/US2019/045636
§ 371 (c)(1),
(2) Date: Feb. 8, 2021

(87) PCT Pub. No.: WO2020/033632
PCT Pub. Date: Feb. 13, 2020

(65) Prior Publication Data
US 2021/0320078 A1 Oct. 14, 2021

Related U.S. Application Data

(60) Provisional application No. 62/715,916, filed on Aug. 8, 2018.

(51) Int. Cl.
*H01L 23/00* (2006.01)
*H01L 23/10* (2006.01)
(Continued)

(52) U.S. Cl.
CPC .............. *H01L 24/13* (2013.01); *H01L 23/10* (2013.01); *H01L 23/3733* (2013.01);
(Continued)

(58) Field of Classification Search
CPC ..... H01L 24/13; H01L 23/10; H01L 23/3733; H01L 23/49816; H01L 23/49827;
(Continued)

(56) References Cited

U.S. PATENT DOCUMENTS 5,585,671 A * 12/1996 Nagesh ............... H01L 23/367
257/713
7,736,414 B1 6/2010 Zinn
(Continued)

FOREIGN PATENT DOCUMENTS

| CN | 102150228 B | * | 2/2016 | ............. H01G 4/008 |
| WO | 2018063746 | | 4/2018 | |
| WO | WO-2018063351 A1 | * | 4/2018 | ......... H01L 21/4853 |

OTHER PUBLICATIONS

Zürcher et al., All-Copper Flip Chip Interconnects by Pressureless and Low Temperature Nanoparticle Sintering, 2016, pp. 343-349 (Year: 2016).*
(Continued)

*Primary Examiner* — Douglas W Owens
(74) *Attorney, Agent, or Firm* — Vorys, Safer, Seymour and Pease LLP

(57) ABSTRACT

Electronic assemblies may be fabricated with interconnects of different types present in multiple locations and comprising fused copper nanoparticles. Each interconnect or a portion thereof comprises a bulk copper matrix formed from fusion of copper nanoparticles or a reaction product formed from copper nanoparticles. The interconnects may comprise a copper-based wire bonding assembly, a copper-based flip chip connection, a copper-based hermetic seal assembly, a copper-based connector between an IC substrate and a package substrate, a copper-based component interconnect, a copper-based interconnect comprising via copper for establishing electrical communication between opposite faces of a package substrate, a copper-based interconnect defining a heat channel formed from via copper, and any combination thereof.

13 Claims, 7 Drawing Sheets

(51) Int. Cl.
*H01L 23/373* (2006.01)
*H01L 23/498* (2006.01)
*H01L 25/065* (2023.01)

(52) U.S. Cl.
CPC .. *H01L 23/49816* (2013.01); *H01L 23/49827* (2013.01); *H01L 24/05* (2013.01); *H01L 24/11* (2013.01); *H01L 24/16* (2013.01); *H01L 24/45* (2013.01); *H01L 24/48* (2013.01); *H01L 25/0652* (2013.01); *H01L 25/0657* (2013.01); *H01L 2224/0401* (2013.01); *H01L 2224/05647* (2013.01); *H01L 2224/1132* (2013.01); *H01L 2224/13147* (2013.01); *H01L 2224/16227* (2013.01); *H01L 2224/45147* (2013.01); *H01L 2224/48227* (2013.01); *H01L 2225/0652* (2013.01); *H01L 2225/06513* (2013.01); *H01L 2225/06517* (2013.01); *H01L 2225/06541* (2013.01)

(58) Field of Classification Search
CPC ......... H01L 24/05; H01L 24/11; H01L 24/16; H01L 24/45; H01L 24/48; H01L 25/0652; H01L 25/0657; H01L 2224/0401; H01L 2224/05647; H01L 2224/1132; H01L 2224/13147; H01L 2224/16227; H01L 2224/45147; H01L 2224/48227; H01L 2225/06513; H01L 2225/06517; H01L 2225/0652; H01L 2225/06541; H01L 23/3736; H01L 23/42; H01L 24/81
See application file for complete search history.

(56) References Cited

U.S. PATENT DOCUMENTS

| | | | |
|---|---|---|---|
| 8,105,414 B2 | 1/2012 | Zinn | |
| 8,192,866 B2 | 6/2012 | Golightly et al. | |
| 8,486,305 B2 | 7/2013 | Zinn et al. | |
| 8,834,747 B2 | 9/2014 | Zinn | |
| 9,005,483 B2 | 4/2015 | Zinn et al. | |
| 9,095,898 B2 | 8/2015 | Zinn | |
| 9,379,007 B2* | 6/2016 | Arvin | H01L 24/11 |
| 9,700,940 B2 | 7/2017 | Zinn | |
| 9,881,895 B2 | 1/2018 | Stoltenberg et al. | |
| 10,616,994 B2 | 4/2020 | Zinn | |
| 11,337,010 B2* | 5/2022 | Piechocinski | H04R 19/04 |
| 11,380,537 B2* | 7/2022 | Kim | C11D 7/08 |
| 11,469,206 B2* | 10/2022 | Elsherbini | H01L 25/50 |
| 2007/0108590 A1* | 5/2007 | Lee | H01L 23/49816 |
| | | | 257/E23.06 |
| 2007/0187812 A1 | 8/2007 | Izumi | |
| 2007/0222056 A1 | 9/2007 | Bauer et al. | |
| 2009/0294947 A1 | 12/2009 | Tain et al. | |
| 2009/0302445 A1* | 12/2009 | Pagaila | H01L 25/0657 |
| | | | 257/E23.181 |
| 2010/0314756 A1* | 12/2010 | Lii | H01L 24/05 |
| | | | 257/737 |
| 2010/0315787 A1* | 12/2010 | Li | H05K 1/0206 |
| | | | 361/709 |
| 2012/0025365 A1 | 2/2012 | Haba | |
| 2014/0374079 A1 | 12/2014 | Zinn et al. | |
| 2017/0287872 A1* | 10/2017 | Shen | H01L 21/4882 |
| 2018/0124928 A1* | 5/2018 | Rathburn | H05K 3/425 |
| 2018/0151471 A1* | 5/2018 | Cook | H01L 23/3677 |
| 2018/0317312 A1* | 11/2018 | Viswanathan | H01L 24/97 |
| 2018/0320984 A1* | 11/2018 | Lewis | F28D 15/04 |
| 2018/0330966 A1* | 11/2018 | Scanlan | H01L 24/19 |
| 2020/0006293 A1* | 1/2020 | Sankman | H01L 24/17 |

OTHER PUBLICATIONS

Zürcher et al., Nanoparticle Assembly and Sintering Towards All-Copper Flip Chip Interconnect, 2015, IEEE, pp. 1115-1121 (Year: 2015).*
International Search Report and Written Opinion for PCT/US2019/045636 dated Feb. 12, 2020.

* cited by examiner

ELECTRONICS ASSEMBLIES EMPLOYING COPPER IN MULTIPLE LOCATIONS

BACKGROUND

Modern electronic assemblies contain numerous interconnects between the various board components. The purpose of a given interconnect may be thermal, electrical or structural in nature. Conventional interconnects are usually made from epoxies or tin- and/or lead-based solders due to their relatively low processing temperatures, and low material and processing costs. Unfortunately, these materials are not ideally suited for a number of applications, and current interconnects may exhibit several drawbacks and limitations as a result.

Epoxies may be desirable for forming interconnects due to their good adhesion to most materials, high bond strength, low-temperature curing conditions, and resistance to thermal and mechanical stresses. However, epoxies exhibit dismal electrical and thermal conductivity. While most interconnects made with epoxies solidify relatively quickly, it actually takes many hours for the epoxy to cure fully and achieve maximum mechanical strength. Once cured, such interconnects do not reflow or creep, thereby creating a permanent bond, and rework is not possible. Without the ability to rework an interconnect, such as to replace a failed board component, replacement of the entirety of an electronic assembly may instead be necessary in the event of device failure. To improve their thermal and electrical conductivity values, epoxies may be loaded with silver, which significantly increases their cost.

Solders, especially lead-based solders, are generally inexpensive, with the exception of some specialty solders incorporating noble metals like gold-tin or rare metals such as bismuth or indium. While solders may be reflowed to address a failed board component, issues with solder wicking between adjacent joints during reflow are common, especially when contacts are close together. This issue can decrease reliability of a device due to the risk of shorting, thereby limiting packaging miniaturization and higher-level integration of electronic circuits. As a non-limiting example, conventional solders usually cannot support system designs for decreasing interconnect pitches beyond a specified threshold, as the solder melt may spread and result in shorting. Furthermore, by forming a liquid state during processing, conventional solders sometimes suffer from void formation, which may impact the mechanical strength and electrical performance of an interconnect or similar solder joint.

The melting point (i.e., the reflow or processing temperature) of a solder is frequently a limiting factor in its use in electronic applications. The processing temperature of a solder (i.e., at or above the melting point) and the maximum operating temperature of a structure formed therefrom, such as an interconnect, are closely linked. Namely, the operating temperature has to be kept below, oftentimes significantly below, the reflow temperature to avoid softening and creep of the solder material. Systems using eutectic lead-tin solder (melting point=183° C.) have to operate at a lower maximum temperature than is desirable in some cases due to this issue. While lead-free solders, such as the SnAgCu (SAC) family, may exhibit higher operating temperatures as a consequence of their higher melting points (e.g., >215° C.), they are more brittle and can grow tin whiskers during operation. Solder materials having a high tin content, such as the SAC family, can be particularly susceptible toward tin whisker growth during operation, which can cause short circuiting and arcing between contacts and components, potentially resulting in catastrophic device failure. High-lead solders can operate at even greater temperatures due to their higher melting points of around 300° C., but they are environmentally harmful and do not comply with RoHS protocols. New RoHS-compliant lead-free solders require higher temperatures for reflow (240-260° C. for SAC solders), thereby increasing fabrication costs.

Solders generally exhibit higher thermal and electrical conductivity values than do epoxies. While better than epoxies, the thermal performance of conventional solders is generally very poor, typically $\frac{1}{7}^{th}$ to $\frac{1}{10}^{th}$ that of highly conductive metals like copper, for example. In contrast to epoxies, solder joints oftentimes display dismal mechanical behavior, such as bonding strength. As conventional solder metals are soft, they easily deform under stress, oftentimes giving rise to creep issues. Even though many automobile companies receive exemptions under RoHS protocols and still use lead-based solders for specific applications for which no suitable alternative is available, such solders are still known to be relatively soft and particularly susceptible to creep. These issues may lead to premature device failure, or in some cases, an outright inability to fabricate a device intended for particular operating conditions.

Molten solder may lead to several problems when joining two surfaces through an interface, such as in an electronic assembly. First, uneven solder bondline thicknesses may occur when a solder becomes molten during soldering. Lack of parallelism between a component and a substrate may result in hotspots or variations in thermal performance. Second, surface tension of a solder may result in wicking of the solder away from a joint during reflow. Third, molten solder may limit the diameter pitch of solder balls. As such, as electronic components decrease in size, solder balls reach a floor for a diameter pitch that may be used effectively.

Copper-only (substantially pure copper) materials are theoretically desirable for forming interconnects due to their low material cost and high thermal and electrical conductivity values. However, existing processing conditions to convert copper metal into one or more interconnects is very difficult due to the high melting point (1084° C.) for this metal, which offsets the aforementioned advantages. In short, the temperatures required to form liquid copper metal are far too high for substrates and other materials commonly used in electronic manufacturing. In the limited cases where copper has been used in some form, combining copper with conventional materials in electronic assemblies can be problematic due to several factors. For example, special interlayers and coatings have been developed to improve device reliability when copper is present, such as nickel-phosphide diffusion barrier layers, in the common ENIG (electroless nickel plating/gold immersion) pad finish. Such diffusion barriers may limit migration of copper atoms into the surrounding electronic materials, which may undesirably impact device performance. However, this coating material exhibits a high electrical resistance (75 µOhm/cm—45 times higher than Cu and greater than 10 times that of tin/lead solders), thereby impacting overall device performance in other ways. The interdiffusion of tin-based solders and copper may also create brittle intermetallic compounds that can lead to device failure and reliability issues. Further, Kirkendall voids may form at the interface between conventional solder and copper due to diffusivity differences between copper and the solder, thereby creating structural flaws that can impact mechanical performance. Lastly, the mismatch of CTE (coefficient of thermal expansion) at one or more interfaces may lead to thermomechanical stress during repeated thermal cycles.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, as will occur to one having ordinary skill in the art and having the benefit of this disclosure.

DETAILED DESCRIPTION

Figure 1:
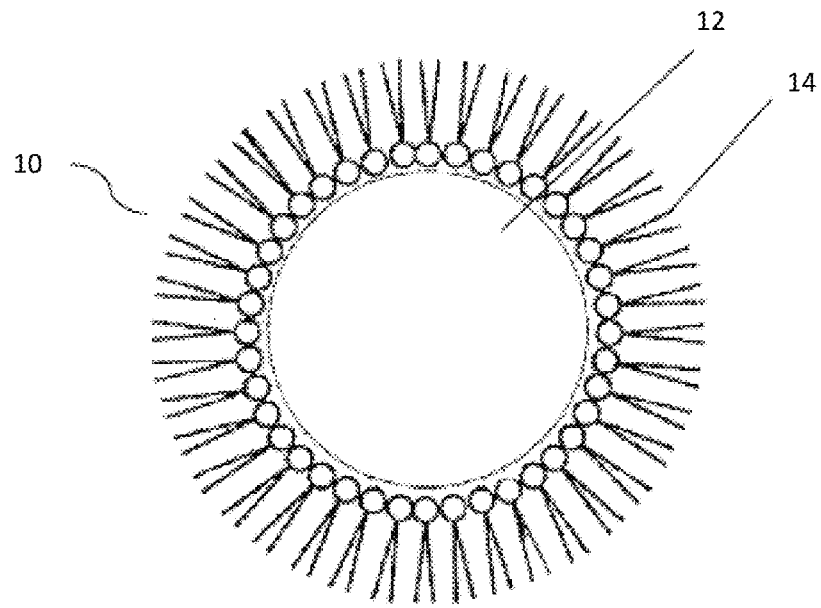
FIGS. 1 and 2 show diagrams of presumed structures of metal nanoparticles having a surfactant coating thereon.

The present disclosure is generally directed to electronic assemblies and, more specifically, electronic assemblies incorporating copper in multiple locations, particularly as interconnects, and methods for their production.

There are multiple types of interconnects that may be present in an electronic assembly. Conventionally, interconnects are formed with epoxy or solder. Despite their common use, epoxies and solders have limitations that are oftentimes not readily overcome. Copper would be a desirable metal for forming various types of interconnects in an electronic assembly, but the high processing temperature of copper metal leads to incompatibilities with most substrate materials in common use. Moreover, use of molten copper metal when forming an interconnect may lead to issues similar to those encountered when reflowing a solder.

The present disclosure demonstrates how solders and epoxies may be replaced in multiple locations in an electronic assembly with a much more robust material, namely copper. Instead of using a reflowable solder, molten copper, or a curable epoxy, the present disclosure describes how a copper nanoparticle (nanocopper)-based material, specifically a copper nanoparticle paste composition, can be processed at relatively low temperatures (~200° C.) to form a connection (interconnect) comprising a bulk copper matrix having a much higher melting point (1084° C.) than do the copper nanoparticles themselves. Thus, copper nanoparticles allow the processing temperature employed for device manufacturing and the effective operating temperature during use to be decoupled from one another. That is, copper nanoparticles allow low-temperature formation of an interconnect to be realized, with the resulting bulk copper matrix formed under the processing conditions being be compatible with much higher operating temperatures during use. For example, the bulk copper matrix formed from the copper nanoparticles may allow operating temperatures of up to at least about 900° C. or at least about 940° C. to be realized, including any temperature in between. Even higher temperature operating conditions may be possible in some circumstances.

Advantageously, formation of an interconnect in an electronic device from copper nanoparticles may alleviate the deficiencies of conventional solders and epoxies. As described herein, low-temperature processing of copper nanoparticles is made possible by the heightened activity of the copper nanoparticles compared to the corresponding bulk metal. As a result, copper nanoparticles fuse together at a temperature much lower than the melting point of bulk copper metal, there allowing formation of an interconnect to be realized at low processing temperatures. Once the copper nanoparticles have been fused together, the resulting bulk copper matrix exhibits properties similar to those of the corresponding bulk copper metal, therefore offering compatibility with high-temperature operating conditions without introducing the complexity of working with molten copper metal. A bulk copper matrix formed from copper nanoparticles also affords much higher electrical and thermal conductivity values than are possible with epoxy or solder. Thus, electronic assemblies having copper-based interconnects in multiple locations can be readily fabricated according to the present disclosure to eliminate the common drawbacks typically associated with epoxy and conventional solder. Electronic assemblies having all (exclusively) copper-based interconnects may be possible in some cases.

Fused copper nanoparticles may have up to 10 times greater resistance to electromigration and up to 10 times greater thermal and electrical conductivity compared to conventional solder, significantly increasing the lifetime and performance of electronics formed therefrom. Copper nanoparticles within the copper nanoparticle paste compositions described herein do not display flow as a liquid state when heated during the fusion process, which makes interconnect formation easier to control by eliminating wicking during fusion and reducing the chance of subsequent shorting. Instead, the fusion of copper nanoparticles is more akin to solid state sintering, with a transient liquid state not being formed during the fusion process. Nanoparticle fusion only requires a relatively low temperature of about 190-240° C. at atmospheric pressure to achieve a bulk copper matrix comprising at least 90% dense bulk copper metal within an interconnect. Nanoparticle fusion may also be promoted by application of sufficient pressure in some cases. For thin layers of copper nanoparticle paste compositions or small deposits, the fusion time can be as short as about 4-8 min. Under certain conditions, copper nanoparticles can also be resistively welded in air, although an inert atmosphere can also be used if minimization of copper oxidation is desired. Advantageously, copper nanoparticle paste compositions can be used for injection molding of complex parts, with some combination of pressure and temperature being used to promote nanoparticle consolidation into a bulk copper matrix. Copper nanoparticles are also compatible with photolithography processes, having demonstrated ability to make lines as small as 1 micron in dimension. As such, a number of processes may be applicable to form interconnects comprising a bulk copper matrix according to the disclosure herein.

Compared to solder, which exhibits closely coupled processing and operating temperatures, copper nanoparticles promote complete decoupling of processing temperature and operating temperature. Fused nanocopper (a bulk copper matrix having 90+% density) can operate effectively at temperatures up to about 900° C. or up to about 940° C., particularly when utilizing grain growth inhibitors to promote temperature stability of the microstructure of the resulting bulk copper matrix. A bulk copper matrix obtained from fusion of copper nanoparticles also exhibits a tensile strength of about 88 MPa with little plastic deformation, such that creep is almost absent. Compared to solder, there are no Kirkendall voids formed at copper interfaces formed from copper nanoparticles due to the pure copper interface obtained following nanoparticle fusion. The CTE of fused copper nanoparticles (23 ppm) is also close to that of pure copper (17 ppm).

Illustrative locations in which structures formed from copper nanoparticles may be used in an electronic assembly include one or more of the following: connections and packaging, thermal interface materials, conductive lines and traces, photovoltaic cells, emulsions and coatings, copper-aluminum brazing, flat panel and touch screen displays, hermetic sealing, and any combination thereof. At least some of these structures may be considered interfaces or interconnects, which may provide structural stability and/or thermal or electrical conductivity within an electronic assembly. Illustrative configurations for various types of interfaces and interconnects and advantages thereof are discussed further herein.

Copper nanoparticles in paste form provide a number of processing and operational advantages that are unmet by conventional solder and epoxy materials. According to the present disclosure, copper nanoparticles in paste form can be incorporated in multiple locations within an electronic assembly to provide a number of advantages that are not presently being met by conventional solder and epoxy materials. Such approaches may be referred to herein as being an all-copper electronic system (ACES) when the entirety of the interconnects in an electronic assembly comprise a bulk copper matrix formed from fused copper nanoparticles. Although such systems are referred to as being "all-copper," it is to be appreciated that every conventional electronic component need not necessarily be replaced by copper, nor does the system need to consist solely of copper or copper components. In addition, a particular system may be "all-copper" when at least a portion of each interconnect comprises copper, particularly fused copper nanoparticles. Thus, certain ACES configurations may feature only the interconnects being formed from copper, at least in part. Multi-layer integrated circuit assemblies are also compatible with the disclosure herein.

In power management applications, significant power savings can be achieved by switching from solder to a bulk copper matrix formed from fused copper nanoparticles. Circuit boards can contain thousands of solder contacts. A typical interconnect formed from solder can have a 25-50% higher resistance compared to a comparable interconnect comprising a bulk copper matrix formed according to the disclosure herein. By utilizing all-copper electronic assemblies or electronic assemblies comprising a significant amount of interconnects formed from fused copper nanoparticles, cooler operating temperatures may be realized due to reduced resistive or Joule heating. Higher signal speeds for all-copper or similar systems may also be realized. In ball grid arrays and flip chip packaging, for example, lower resistance of copper pillars compared to solder balls may allow for the use of more contacts to promote information transport rather than power to operate the component. Higher circuit stabilities and better consistency may be realized through the disclosure herein.

All-copper electronic assemblies also allow a Ni(P) interface layer to be eliminated in some instances. Due to high resistance of the Ni(P) interface layer, and its accompanying signal losses, all-copper electronic assemblies may afford better operational performance.

The most common pad finish (ENIG-RoHS compliant) currently used on circuit boards and components consists of two metallic layers, a 25-200 nm immersion Au coating over a 2.5-5 µm electroless Ni coating containing 5-15% phosphorous. The Au coating is typically porous and can lead to ready cracking and delamination at the interface to the solder ball/contact. A copper-based assembly completely avoids this potential failure mode. During bake out and even normal reflow in air, the ENIG oxidizes due to its porosity, which raises contact resistance. The increased contact resistance can lead to a 50% increase in overall resistance or more. In some cases, the overall resistance can increase by two orders of magnitude. Again, a copper-based assembly can avoid this issue.

Before further discussing the embodiments of the present disclosure in further detail, a brief description of metal nanoparticles and metal nanoparticle paste formulations (compositions) suitable for use in the present disclosure will first be provided, with copper nanoparticles being a representative example of metal nanoparticles that may be present as a majority metal nanoparticle in the metal nanoparticle paste compositions. Metal nanoparticles exhibit a number of properties that can differ significantly from those of the corresponding bulk metal. One property of metal nanoparticles that can be of particular importance is nanoparticle fusion or consolidation that occurs at the metal nanoparticles' fusion temperature. As used herein, the term "fusion temperature" refers to the temperature at which a metal nanoparticle liquefies, thereby giving the appearance of melting. As used herein, the terms "fusion," "sintering" and "consolidation" synonymously refer to the coalescence or partial coalescence of metal nanoparticles with one another to form a larger mass (sintered mass) of bulk metal, thereby defining a bulk metal matrix, such as bulk copper matrix. During nanoparticle fusion, the metal nanoparticles undergo consolidation to form the bulk metal matrix without proceeding through a liquid state.

Upon decreasing in size, particularly below about 20 nm in equivalent spherical diameter, the temperature at which metal nanoparticles coalesce drops dramatically from that of the corresponding bulk metal. For example, copper nanoparticles having a size of about 20 nm or less can have fusion temperatures of about 240° C. or below, or about 220° C. or below, or about 200° C. or below, in comparison to bulk copper's melting point of 1084° C. Thus, the consolidation of metal nanoparticles taking place at the fusion temperature can allow objects containing a bulk metal matrix, such as one or more interconnects in an electronic assembly, to be fabricated at significantly lower processing temperatures than when working directly with the bulk metal itself as a starting material. Once the bulk metal matrix has been formed, the melting point of the bulk metal matrix resembles that of the bulk metal and contains a plurality of grain boundaries.

As used herein, the term "metal nanoparticle" refers to metal particles that are about 100 nm or less in size, without particular reference to the shape of the metal particles. As used herein, the term "copper nanoparticle" refers to a metal nanoparticle made from copper or predominantly copper.

As used herein, the term "micron-scale metal particles" refers to metal particles that are about 100 nm or greater in size in at least one dimension.

The terms "consolidate," "consolidation" and other variants thereof are used interchangeably herein with the terms "fuse," "fusion" and other variants thereof.

As used herein, the terms "partially fused," "partial fusion," and other derivatives and grammatical equivalents thereof refer to the partial coalescence of metal nanoparticles with one another. Whereas totally fused metal nanoparticles retain essentially none of the structural morphology of the original unfused metal nanoparticles (i.e., they resemble bulk metal with minimal grain boundaries), partially fused metal nanoparticles retain at least some of the structural morphology of the original unfused metal nanoparticles. The properties of partially fused metal nanoparticles can be intermediate between those of the corresponding bulk metal and the original unfused metal nanoparticles.

A number of scalable processes for producing bulk quantities of metal nanoparticles in a targeted size range have been developed. Most typically, such processes for producing metal nanoparticles take place by reducing a metal precursor in the presence of one or more surfactants. The metal nanoparticles can then be isolated and purified from the reaction mixture by common isolation techniques and processed into a paste composition, if desired.

Any suitable technique can be employed for forming the metal nanoparticles used in the nanoparticle paste compositions and processes described herein. Particularly facile metal nanoparticle fabrication techniques are described in U.S. Pat. Nos. 7,736,414, 8,105,414, 8,192,866, 8,486,305, 8,834,747, 9,005,483, 9,095,898, and 9,700,940, each of which is incorporated herein by reference in its entirety. As described therein, metal nanoparticles can be fabricated in a narrow size range by reduction of a metal salt in a solvent in the presence of a suitable surfactant system, which can include one or more different surfactants. Further description of suitable surfactant systems follows below. Without being bound by any theory or mechanism, it is believed that the surfactant system can mediate the nucleation and growth of the metal nanoparticles, limit surface oxidation of the metal nanoparticles, and/or inhibit metal nanoparticles from extensively aggregating with one another prior to being at least partially fused together. Suitable organic solvents for solubilizing metal salts and forming metal nanoparticles can include, for example, formamide, N,N-dimethylformamide, dimethyl sulfoxide, dimethylpropylene urea, hexamethylphosphoramide, tetrahydrofuran, and glyme, diglyme, triglyme, and tetraglyme. Reducing agents suitable for reducing metal salts and promoting the formation of metal nanoparticles can include, for example, an alkali metal in the presence of a suitable catalyst (e.g., lithium naphthalide, sodium naphthalide, or potassium naphthalide) or borohydride reducing agents (e.g., sodium borohydride, lithium borohydride, potassium borohydride, or tetraalkylammonium borohydrides).

Figure 2:
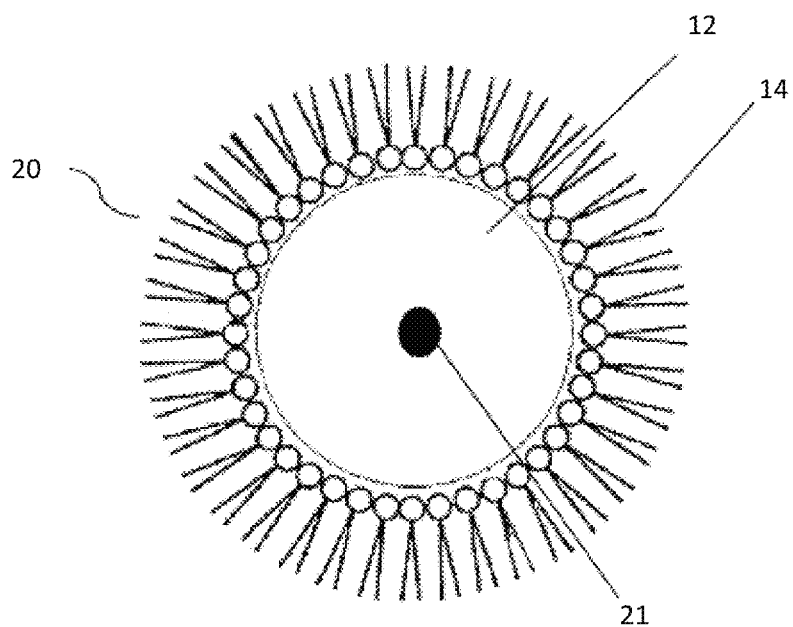

FIGS. 1 and 2 show diagrams of presumed structures of metal nanoparticles having a surfactant coating thereon. As shown in FIG. 1, metal nanoparticle 10 includes metallic core 12 and surfactant layer 14 overcoating metallic core 12. Surfactant layer 14 can contain any combination of surfactants, as described in more detail below. Metal nanoparticle 20, shown in FIG. 2, is similar to that depicted in FIG. 1, except metallic core 12 is grown about nucleus 21, which can be a metal that is the same as or different than that of metallic core 12. Because nucleus 21 is buried deep within metallic core 12 in metal nanoparticle 20, it is not believed to significantly affect the overall nanoparticle properties. In some embodiments, nucleus 21 may comprise a substance that is a grain growth inhibitor, which may be released as the metal nanoparticles undergo consolidation with one another. In some embodiments, the nanoparticles can have an amorphous morphology.

As discussed above, the metal nanoparticles have a surfactant coating containing one or more surfactants upon their surface. The surfactant coating can be formed on the metal nanoparticles during their synthesis. The surfactant coating is generally lost during consolidation of the metal nanoparticles upon heating above the fusion temperature. Formation of a surfactant coating upon metal nanoparticles during their syntheses can desirably limit the ability of the metal nanoparticles to fuse to one another before heating above the fusion temperature, limit agglomeration of the metal nanoparticles, and promote the formation of a population of metal nanoparticles having a narrow size distribution.

Copper can be a particularly desirable metal in the embodiments of the present disclosure due to its low cost, strength, and excellent electrical and thermal conductivity values, as well as additional advantages addressed further herein. Although copper nanoparticles may be advantageous for use in the embodiments herein, it is to be appreciated that other types of metal nanoparticles may be used in alternative embodiments. Other metal nanoparticles that may be useful in electronic applications for forming a bulk metal matrix include, for example, aluminum nanoparticles, palladium nanoparticles, silver nanoparticles, gold nanoparticles, iron nanoparticles, cobalt nanoparticles, nickel nanoparticles, titanium nanoparticles, zirconium nanoparticles, hafnium nanoparticles, tantalum nanoparticles, and the like. Micronsized particles of these metals may be present in paste compositions containing the metal nanoparticles as well, which may provide processing advantages in some cases.

In various embodiments, the surfactant system present within the metal nanoparticles can include one or more surfactants. The differing properties of various surfactants can be used to tailor the properties of the metal nanoparticles. Factors that can be taken into account when selecting a surfactant or combination of surfactants for inclusion upon the metal nanoparticles can include, for example, ease of surfactant dissipation from the metal nanoparticles during nanoparticle fusion, nucleation and growth rates of the metal nanoparticles, the metal component of the metal nanoparticles, and the like.

In some embodiments, an amine surfactant or combination of amine surfactants, particularly aliphatic amines, can be present upon the metal nanoparticles. Amine surfactants can be particularly desirable for use in conjunction with copper nanoparticles. In some embodiments, two amine surfactants can be used in combination with one another. In other embodiments, three amine surfactants can be used in combination with one another. In more specific embodiments, a primary amine, a secondary amine, and a diamine chelating agent can be used in combination with one another. In still more specific embodiments, the three amine surfactants can include a long chain primary amine, a secondary amine, and a diamine having at least one tertiary alkyl group nitrogen substituent. Further disclosure regarding suitable amine surfactants follows hereinafter.

In some embodiments, the surfactant system can include a primary alkylamine. In some embodiments, the primary alkylamine can be a $C_2$-$C_{18}$ alkylamine. In some embodiments, the primary alkylamine can be a $C_7$-$C_{10}$ alkylamine. In other embodiments, a $C_5$-$C_6$ primary alkylamine can also be used. Without being bound by any theory or mechanism, the exact size of the primary alkylamine can be balanced between being long enough to provide an effective inverse micelle structure during synthesis versus having ready volatility and/or ease of handling during nanoparticle consolidation. For example, primary alkylamines with more than 18 carbons can also be suitable for use in the present embodiments, but they can be more difficult to handle because of their waxy character. $C_7$-$C_{10}$ primary alkylamines, in particular, can represent a good balance of desired properties for ease of use.

In some embodiments, the $C_2$-$C_{18}$ primary alkylamine can be n-hexylamine, n-heptylamine, n-octylamine, n-nonylamine, or n-decylamine, for example. While these are all straight chain primary alkylamines, branched chain primary alkylamines can also be used in other embodiments. For example, branched chain primary alkylamines such as, for example, 7-methyloctylamine, 2-methyloctylamine, or 7-methylnonylamine can be used. In some embodiments, such branched chain primary alkylamines can be sterically hindered where they are attached to the amine nitrogen atom. Non-limiting examples of such sterically hindered primary alkylamines can include, for example, t-octylamine, 2-methylpentan-2-amine, 2-methylhexan-2-amine, 2-methylheptan-2-amine, 3-ethyloctan-3-amine, 3-ethylheptan-3-amine, 3-ethylhexan-3-amine, and the like. Additional branching can also be present. Without being bound by any theory or mechanism, it is believed that primary alkylamines can serve as ligands in the metal coordination sphere but be readily dissociable therefrom during metal nanoparticle consolidation.

In some embodiments, the surfactant system can include a secondary amine. Secondary amines suitable for forming metal nanoparticles can include normal, branched, or cyclic $C_4$-$C_{12}$ alkyl groups bound to the amine nitrogen atom. In some embodiments, the branching can occur on a carbon atom bound to the amine nitrogen atom, thereby producing significant steric encumbrance at the nitrogen atom. Suitable secondary amines can include, without limitation, dihexylamine, diisobutylamine, di-t-butylamine, dineopentylamine, di-t-pentylamine, dicyclopentylamine, dicyclohexylamine, and the like. Secondary amines outside the $C_4$-$C_{12}$ range can also be used, but such secondary amines can have undesirable physical properties such as low boiling points or waxy consistencies that can complicate their handling.

In some embodiments, the surfactant system can include a chelating agent, particularly a diamine chelating agent. In some embodiments, one or both of the nitrogen atoms of the diamine chelating agent can be substituted with one or two alkyl groups. When two alkyl groups are present on the same nitrogen atom, they can be the same or different. Further, when both nitrogen atoms are substituted, the same or different alkyl groups can be present. In some embodiments, the alkyl groups can be $C_1$-$C_6$ alkyl groups. In other embodiments, the alkyl groups can be $C_1$-$C_4$ alkyl groups or $C_3$-$C_6$ alkyl groups. In some embodiments, $C_3$ or higher alkyl groups can be straight or have branched chains. In some embodiments, $C_3$ or higher alkyl groups can be cyclic. Without being bound by any theory or mechanism, it is believed that diamine chelating agents can facilitate metal nanoparticle formation by promoting nanoparticle nucleation.

In some embodiments, suitable diamine chelating agents can include N,N'-dialkylethylenediamines, particularly $C_1$-$C_4$ N,N'-dialkylethylenediamines. The corresponding methylenediamine, propylenediamine, butylenediamine, pentylenediamine or hexylenediamine derivatives can also be used. The alkyl groups can be the same or different. $C_1$-$C_4$ alkyl groups that can be present include, for example, methyl, ethyl, propyl, and butyl groups, or branched alkyl groups such as isopropyl, isobutyl, s-butyl, and t-butyl groups. Illustrative N,N'-dialkylethylenediamines that can be suitable for inclusion upon metal nanoparticles include, for example, N,N'-di-t-butylethylenediamine, N,N'-diisopropylethylenediamine, and the like.

In some embodiments, suitable diamine chelating agents can include N,N,N',N'-tetraalkylethylenediamines, particularly $C_1$-$C_4$ N,N,N',N'-tetraalkylethylenedia mines. The corresponding methylenediamine, propylenediamine, butylenediamine, pentylenediamine or hexylenediamine derivatives can also be used. The alkyl groups can again be the same or different and include those mentioned above. Illustrative N,N,N',N'-tetraalkylethylenediamines that can be suitable for use in forming metal nanoparticles include, for example, N,N,N',N'-tetramethylethylenediamine, N,N,N',N'-tetraethylethylenediamine, and the like.

Surfactants other than aliphatic amines can also be present in the surfactant system. In this regard, suitable surfactants can include, for example, pyridines, aromatic amines, phosphines, thiols, or any combination thereof. These surfactants can be used in combination with an aliphatic amine, including those described above, or they can be used in a surfactant system in which an aliphatic amine is not present. Further disclosure regarding suitable pyridines, aromatic amines, phosphines, and thiols follows below.

Suitable aromatic amines can have a formula of $ArNR^1R^2$, where Ar is a substituted or unsubstituted aryl group and $R^1$ and $R^2$ are the same or different. $R^1$ and $R^2$ can be independently selected from H or an alkyl or aryl group containing from 1 to about 16 carbon atoms. Illustrative aromatic amines that can be suitable for use in forming metal nanoparticles include, for example, aniline, toluidine, anisidine, N,N-dimethylaniline, N,N-diethylaniline, and the like. Other aromatic amines that can be used in conjunction with metal nanoparticles can be envisioned by one having ordinary skill in the art.

Suitable pyridines can include both pyridine and its derivatives. Illustrative pyridines that can be suitable for use inclusion upon metal nanoparticles include, for example, pyridine, 2-methylpyridine, 2,6-dimethylpyridine, collidine, pyridazine, and the like. Chelating pyridines such as bipyridyl chelating agents may also be used. Other pyridines that can be used in conjunction with metal nanoparticles can be envisioned by one having ordinary skill in the art.

Suitable phosphines can have a formula of $PR_3$, where R is an alkyl or aryl group containing from 1 to about 16 carbon atoms. The alkyl or aryl groups attached to the phosphorus center can be the same or different. Illustrative phosphines that can be present upon metal nanoparticles include, for example, trimethylphosphine, triethylphosphine, tributylphosphine, tri-t-butylphosphine, trioctylphosphine, triphenylphosphine, and the like. Phosphine oxides can also be used in a like manner. In some embodiments, surfactants that contain two or more phosphine groups configured for forming a chelate ring can also be used. Illustrative chelating phosphines can include 1,2-bisphosphines, 1,3-bisphosphines, and bis-phosphines such as BINAP, for example. Other phosphines that can be used in conjunction with metal nanoparticles can be envisioned by one having ordinary skill in the art.

Suitable thiols can have a formula of RSH, where R is an alkyl or aryl group having from about 4 to about 16 carbon atoms. Illustrative thiols that can present upon metal nanoparticles include, for example, butanethiol, 2-methyl-2-propanethiol, hexanethiol, octanethiol, benzenethiol, and the like. In some embodiments, surfactants that contain two or more thiol groups configured for forming a chelate ring can also be used. Illustrative chelating thiols can include, for example, 1,2-dithiols (e.g., 1,2-ethanethiol) and 1,3-dithiols (e.g., 1,3-propanethiol). Other thiols that can be used in conjunction with metal nanoparticles can be envisioned by one having ordinary skill in the art.

The metal nanoparticles described hereinabove can be incorporated within various formulations or paste compositions, which may facilitate dispensation for forming a connection. Illustrative disclosure directed to such nanoparticle paste compositions or formulations follows hereinafter. Copper nanoparticle paste compositions may be particularly useful for forming an interconnect in the disclosure herein, especially in the presence of a grain growth inhibitor for interconnects or other components that may be exposed to high operating temperatures, particularly with repeated thermal cycling.

Nanoparticle paste compositions can be prepared by dispersing as-produced or as-isolated metal nanoparticles in an organic matrix containing one or more organic solvents and various other optional components. As used herein, the terms "nanoparticle paste formulation" and "nanoparticle paste composition" are used interchangeably and refer synonymously to a fluid composition containing dispersed metal nanoparticles that is suitable for dispensation using a desired technique. Use of the term "paste" does not necessarily imply an adhesive function of the paste alone. Through judicious choice of the organic solvent(s) and other additives, the loading of metal nanoparticles and the like, dispensation of the metal nanoparticles in a desired location may be promoted.

Cracking and shrinkage can sometimes occur during consolidation of the metal nanoparticles. One way in which the nanoparticle pastes can promote a decreased degree of cracking, shrinkage and void formation following metal nanoparticle consolidation is by maintaining a high solids content. More particularly, in some embodiments, the nanoparticle paste compositions can contain at least about 30% metal nanoparticles by weight, particularly about 30% to about 97% metal nanoparticles by weight of the paste composition, or about 50% to about 97% metal nanoparticles by weight of the paste composition, or about 70% to about 97% metal nanoparticles by weight of the paste composition. Moreover, in some embodiments, small amounts (e.g., about 0.01% to about 15% or about 35% or about 60% by weight of the paste composition) of micron-scale metal particles can be present in addition to the metal nanoparticles. Such micron-scale metal particles can desirably promote the fusion of metal nanoparticles into a contiguous mass and further reduce the incidence of cracking and shrinkage. Instead of being liquefied and undergoing direct consolidation, the micron-scale metal particles can simply become joined together upon being contacted with metal nanoparticles that have been raised above their fusion temperature. These factors can reduce the porosity after fusing the metal nanoparticles together. The micron-scale metal particles can contain the same or different metals than the metal nanoparticles, and suitable metals for the micron-scale particles can include, for example, copper, silver, gold, aluminum, tin, and the like. Micron-scale graphite particles may also be included, in some embodiments. Carbon nanotubes and/or graphene may be included, in some embodiments. Still other additives, such as diamond particles or cubic BN (boron nitride) may be included as well.

During consolidation, the copper matrix defined by the fused copper nanoparticles is characterized by a very fine, uniformly distributed nanoporosity (typically 4-15% with a pore size in the range of about 100 nm to about 300 nm, and mostly closed pores) that limits hot spots by ensuring uniform heat distribution across an interface. However, the nanoporosity may range from about 2% to about 15% (i.e., 85%-98% dense fused copper nanoparticles with closed pore nanoporosity and a pore size ranging from about 50 nm to about 500 nm, or about 100 nm to about 300 nm, or about 150 nm to about 250 nm). Several copper bulk matrices described further below specify a bulk copper matrix having a density of 90%. However, it is to be appreciated that this value is representative of the density values that may be attained, particularly a density ranging from about 85% to about 98%.

Micron-scale metal particles may be differentiated from grain growth inhibitors in the disclosure herein, since micron-scale metal particles are less readily incorporated within grain boundaries between consolidated metal nanoparticles due to their relatively large size. Particular examples of grain growth inhibitors or precursors thereto suitable for use in the present disclosure are discussed in further detail hereinbelow.

Decreased cracking and void formation during metal nanoparticle consolidation can also be promoted by judicious choice of the solvent(s) forming the organic matrix. A tailored combination of organic solvents can desirably decrease the incidence of cracking and void formation. More particularly, an organic matrix containing one or more hydrocarbons (saturated, monounsaturated, polyunsaturated (2 or more double bonds) or aromatic), one or more alcohols, one or more amines, and one or more organic acids can be especially effective for this purpose. One or more esters and/or one or more anhydrides may be included, in some embodiments. Without being bound by any theory or mechanism, it is believed that this combination of organic solvents can facilitate the removal and sequestration of surfactant molecules surrounding the metal nanoparticles during consolidation, such that the metal nanoparticles can more easily fuse together with one another. More particularly, it is believed that hydrocarbon and alcohol solvents can passively solubilize surfactant molecules released from the metal nanoparticles by Brownian motion and reduce their ability to become re-attached thereto. In concert with the passive solubilization of surfactant molecules, amine and organic acid solvents can actively sequester the surfactant molecules through a chemical interaction such that they are no longer available for recombination with the metal nanoparticles.

Further tailoring of the solvent composition can be performed to reduce the suddenness of volume contraction that takes place during surfactant removal and metal nanoparticle consolidation. Specifically, more than one member of each class of organic solvent (i.e., hydrocarbons, alcohols, amines, and organic acids), can be present in the organic matrix, where the members of each class have boiling points that are separated from one another by a set degree. For example, in some embodiments, the various members of each class can have boiling points that are separated from one another by about 20° C. to about 50° C. By using such a solvent mixture, sudden volume changes due to rapid loss of solvent can be minimized during metal nanoparticle consolidation, since the various components of the solvent mixture can be removed gradually over a broad range of boiling points (e.g., about 50° C. to about 200° C.).

In some embodiments, at least some of the one or more organic solvents can have a boiling point of about 100° C. or greater. In some embodiments, at least some of the one or more organic solvents can have a boiling point of about 200° C. or greater. In some embodiments, the one or more organic solvents can have boiling points ranging from about 50° C. to about 250° C. In other embodiments, the one or more organic solvents can have boiling points ranging from about 100° C. and about 350° C. Use of high boiling organic solvents can desirably increase the pot life of the nanoparticle paste compositions and limit the rapid loss of solvent, which can lead to cracking and void formation during nanoparticle consolidation. In some embodiments, at least one of the organic solvents can have a boiling point that is higher than the boiling point(s) of the surfactant(s) associated with the metal nanoparticles. Accordingly, surfactant(s) can be removed from the metal nanoparticles by evaporation before removal of the organic solvent(s) takes place.

In some embodiments, the organic matrix can contain one or more alcohols. In various embodiments, the alcohols can include monohydric alcohols, diols, triols, glycol ethers (e.g., diethylene glycol and triethylene glycol), alkanolamines (e.g., ethanolamine, triethanolamine, and the like), or any combination thereof. In some embodiments, one or more hydrocarbons can be present in combination with one or more alcohols. As discussed above, it is believed that alcohol and hydrocarbon solvents can passively promote the solubilization of surfactants as they are removed from the metal nanoparticles by Brownian motion and limit their re-association with the metal nanoparticles. Moreover, hydrocarbon and alcohol solvents only weakly coordinate with metal nanoparticles, so they do not simply replace the displaced surfactants in the nanoparticle coordination sphere. Illustrative but non-limiting examples of alcohol and hydrocarbon solvents that can be present include, for example, light aromatic petroleum distillate (CAS 64742-95-6), hydrotreated light petroleum distillates (CAS 64742-47-8), tripropyleneglycol methyl ether, ligroin (CAS 68551-17-7, a mixture of $C_{10}$-$C_{13}$ alkanes), diisopropyleneglycol monomethyl ether, diethyleneglycol diethyl ether, 2-propanol, 2-butanol, t-butanol, 1-hexanol, 2-(2-butoxyethoxy) ethanol, and terpineol. In some embodiments, polyketone solvents can be used in a like manner.

In some embodiments, the organic matrix can contain one or more amines and one or more organic acids. In some embodiments, the one or more amines and one or more organic acids can be present in an organic matrix that also includes one or more hydrocarbons and one or more alcohols. As discussed above, it is believed that amines and organic acids can actively sequester surfactants that have been passively solubilized by hydrocarbon and alcohol solvents, thereby making the surfactants unavailable for re-association with the metal nanoparticles. Thus, an organic solvent that contains a combination of one or more hydrocarbons, one or more alcohols, one or more amines, and one or more organic acids can provide synergistic benefits for promoting the consolidation of metal nanoparticles. Illustrative but non-limiting examples of amine solvents that can be present include, for example, tallowamine (CAS 61790-33-8), alkyl ($C_8$-$C_{18}$) unsaturated amines (CAS 68037-94-5), di(hydrogenated tallow)amine (CAS 61789-79-5), dialkyl ($C_8$-$C_{20}$) amines (CAS 68526-63-6), alkyl ($C_{10}$-$C_{16}$) dimethyl amine (CAS 67700-98-5), alkyl ($C_{14}$-$C_{18}$) dimethyl amine (CAS 68037-93-4), dihydrogenated tallowmethyl amine (CAS 61788-63-4), and trialkyl ($C_6$-$C_{12}$) amines (CAS 68038-01-7). Illustrative but non-limiting examples of organic acid solvents that can be present in the nanoparticle paste compositions include, for example, octanoic acid, nonanoic acid, decanoic acid, caprylic acid, pelargonic acid, undecylic acid, lauric acid, tridecylic acid, myristic acid, pentadecanoic acid, palmitic acid, margaric acid, stearic acid, nonadecylic acid, α-linolenic acid, stearidonic acid, oleic acid, and linoleic acid.

In some embodiments, the organic matrix can include more than one hydrocarbon, more than one alcohol, more than one amine, and more than one organic acid. For example, in some embodiments, each class of organic solvent can have two or more members, or three or more members, or four or more members, or five or more members, or six or more members, or seven or more members, or eight or more members, or nine or more members, or ten or more members. Moreover, the number of members in each class of organic solvent can be the same or different. Particular benefits of using multiple members of each class of organic solvent are described hereinafter.

One particular advantage of using multiple members within each class of organic solvent can include the ability to provide a wide spread of boiling points in the nanoparticle paste compositions. By providing a wide spread of boiling points, the organic solvents can be removed gradually as the temperature rises while affecting metal nanoparticle consolidation, thereby limiting volume contraction and disfavoring cracking. By gradually removing the organic solvent in this manner, less temperature control may be needed to affect slow solvent removal than if a single solvent with a narrow boiling point range was used. In some embodiments, the members within each class of organic solvent can have a window of boiling points ranging between about 50° C. and about 200° C., or between about 50° C. and about 250° C., or between about 100° C. and about 200° C., or between about 100° C. and about 250° C. Higher boiling solvents may be used as well. In more particular embodiments, the various members of each class of organic solvent can each have boiling points that are separated from one another by at least about 20° C., specifically about 20° C. to about 50° C. More specifically, in some embodiments, each hydrocarbon can have a boiling point that differs by about 20° C. to about 50° C. from other hydrocarbons in the organic matrix, each alcohol can have a boiling point that differs by about 20° C. to about 50° C. from other alcohols in the organic matrix, each amine can have a boiling point that differs by about 20° C. to about 50° C. from other amines in the organic matrix, and each organic acid can have a boiling point that differs by about 20° C. to about 50° C. from other organic acids in the organic matrix. The more members of each class of organic solvent that are present, the smaller the differences become between the boiling points. By having smaller differences between the boiling points, solvent removal can be made more continual, thereby limiting the degree of volume contraction that occurs at each stage. A reduced degree of cracking can occur when four to five or more members of each class of organic solvent are present (e.g., four or more hydrocarbons, four or more alcohols, four or more amines, and four or more organic acids; or five or more hydrocarbons, five or more alcohols, five or more amines, and five or more organic acids), each having boiling points that are separated from one another within the above range.

In various embodiments, the metal nanoparticles used in the nanoparticle paste compositions can be about 20 nm or less in size. In some embodiments, metal nanoparticles may be up to about 75 nm in size. As discussed above, metal nanoparticles in this size range have fusion temperatures that are significantly lower than those of the corresponding bulk metal and readily undergo consolidation with one another as a result. In some embodiments, metal nanoparticles that are about 20 nm or less in size can have a fusion temperature of about 220° C. or below (e.g., a fusion temperature in the range of about 140° C. to about 220° C.) or about 200° C. or below, which can provide advantages that are noted above. In some embodiments, at least a portion of the metal nanoparticles can be about 10 nm or less in size, or about 5 nm or less in size. In some embodiments, at least a portion of the metal nanoparticles can range between about 1 nm in size to about 20 nm in size, or between about 1 nm in size and about 10 nm in size, or between about 1 nm in size to about 5 nm in size, or between about 3 nm in size to about 7 nm in size, or between about 5 nm in size to about 20 nm in size. In some embodiments, substantially all of the metal nanoparticles can reside within these size ranges. In some embodiments, larger metal nanoparticles can be combined in the nanoparticle paste compositions with metal nanoparticles that are about 20 nm in size or less. For example, in some embodiments, metal nanoparticles ranging from about 1 nm to about 10 nm in size can be combined with metal nanoparticles that range from about 25 nm to about 50 nm in size, or with metal nanoparticles that range from about 25 nm to about 100 nm in size. As further discussed below, micron-scale metal particles or nanoscale particles can also be included in the nanoparticle paste compositions in some embodiments. Although larger metal nanoparticles and micron-scale metal particles may not be liquefiable at the low temperatures of their smaller counterparts, they can still become consolidated upon contacting the smaller metal nanoparticles that have formed a liquid-like state at or above their fusion temperature, as generally discussed above.

In addition to metal nanoparticles and organic solvents, other additives can also be present in the nanoparticle paste compositions. Such additional additives can include, for example, rheology control aids, thickening agents, micron-scale conductive additives, nanoscale conductive additives, and any combination thereof. Chemical additives can also be present. As discussed hereinafter, the inclusion of micron-scale conductive additives, such as micron-scale metal particles, can be particularly advantageous. Nanoscale or micron-scale diamond or other thermally conductive additives may be desirable to include in some instances.

In some embodiments, the paste compositions can contain about 0.01% to about 15% micron-scale metal particles by weight, or about 1% to about 10% micron-scale metal particles by weight, or about 1% to about 5% micron-scale metal particles by weight Micron-scale particles can also be present in the paste compositions in an amount of about 10% to about 35% by weight, or about 15% to about 35% by weight, or about 20% to about 35% by weight, or about 25% to about 35% by weight. Inclusion of micron-scale metal particles in the nanoparticle paste compositions can desirably reduce the incidence of cracking that occurs during consolidation of the metal nanoparticles when forming a contiguous metal trace. Without being bound by any theory or mechanism, it is believed that the micron-scale metal particles can become consolidated with one another as the metal nanoparticles form a liquid-like state and form a transient liquid coating upon the micron-scale metal particles. In some embodiments, the micron-scale metal particles can range between about 500 nm to about 100 microns in size in at least one dimension, or from about 500 nm to about 10 microns in size in at least one dimension, or from about 100 nm to about 5 microns in size in at least one dimension, or from about 100 nm to about 10 microns in size in at least one dimension, or from about 100 nm to about 1 micron in size in at least one dimension, or from about 1 micron to about 10 microns in size in at least one dimension, or from about 5 microns to about 10 microns in size in at least one dimension, or from about 1 micron to about 100 microns in size in at least one dimension. The micron-size metal particles can contain the same metal as the metal nanoparticles or contain a different metal. Thus, metal alloys can be fabricated by including micron-size metal particles in the paste compositions with a metal differing from that of the metal nanoparticles. Suitable micron-scale metal particles can include, for example, Cu, Ni, Al, Fe, Co, Mo, Ag, Zn, Sn, Au, Pd, Pt, Ru, Mn, Cr, Ti, V, Mg or Ca particles. Non-metal particles such as, for example, Si and B micron-scale particles can be used in a like manner. In some embodiments, the micron-scale metal particles can be in the form of metal flakes, such as high aspect ratio copper flakes, for example. That is, in some embodiments, the nanoparticle paste compositions described herein can contain a mixture of copper nanoparticles and high aspect ratio copper flakes. Specifically, in some embodiments, the paste compositions can contain about 30% to about 97% copper nanoparticles by weight and about 0.01% to about 15% high aspect ratio copper flakes by weight.

Other micron-scale metal particles that can be used equivalently to high aspect ratio metal flakes include, for example, metal nanowires and other high aspect ratio particles, which can be up to about 300 microns in length. The ratio of metal nanoparticle to metal nanowires may range between about 10:1 to about 40:1, according to various embodiments. Suitable nanowires may have a length of between about 5 microns and about 50 microns, and a diameter between about 100 nm and about 200 nm, for example.

In some embodiments, nanoscale conductive additives can also be present in the paste compositions. These additives can desirably provide further structural reinforcement and reduce shrinkage during metal nanoparticle consolidation. Moreover, inclusion of nanoscale conductive additives can increase electrical and thermal conductivity values that can approach or even exceed that of the corresponding bulk metal following nanoparticle consolidation. In some embodiments, the nanoscale conductive additives can have a size in at least one dimension ranging between about 1 micron and about 100 microns, or ranging between about 1 micron and about 300 microns. Suitable nanoscale conductive additives can include, for example, carbon nanotubes, graphene, and the like. When present, the nanoparticle paste compositions can contain about 1% to about 10% nanoscale conductive additives by weight, or about 1% to about 5% nanoscale conductive additives by weight.

Additional substances that can also optionally be present include, for example, flame retardants, UV protective agents, antioxidants, carbon black, graphite, fiber materials (e.g., chopped carbon fiber materials), diamond, cubic BN, and the like.

Nanoparticle paste compositions suitable for use in packaging applications and forming one or more interconnects in an electronic assembly according to the present disclosure can be formulated using any of the nanoparticle paste compositions described hereinabove, including those in which a grain growth inhibitor is further included, particularly a grain growth inhibitor comprising a metal. The grain growth inhibitor may be included in a suitable form such that the grain growth inhibitor is capable of entering grain boundaries following nanoparticle consolidation. If not included in a suitable form, ineffective grain growth inhibition may occur, even if the grain growth inhibitor otherwise comprises a substance that is capable of providing grain growth inhibition.

In particular embodiments, nanoparticle paste compositions suitable for use in the disclosure herein may comprise copper nanoparticles and a suitable amount of a grain growth inhibitor to prevent substantial grain growth upon heating a bulk copper matrix formed from the copper nanoparticles. The suitable amount of the grain growth inhibitor may range between about 0.01 wt. % to about 15 wt. % of the nanoparticle paste composition, according to various embodiments. Effective temperature ranges over which the grain growth inhibitor may inhibit grain growth are considered below.

Suitable grain growth inhibitors may be metal particles that are insoluble in a copper matrix. Suitable grain growth inhibitors may be foreign nanoparticles that are in the 10 nm and under size range. Grain growth inhibitors comprising a metal, particularly metal nanoparticles having a size of about 10 nm or under, may be particularly desirable for inclusion in a bulk copper matrix. The small nanoparticle size allows the grain growth inhibitors to access the grain boundaries readily. Inclusion of the grain growth inhibitors limits grain growth by interface or Zener pinning and ensures that the nano-grain structure is retained even after prolonged exposure to high temperatures, frequent temperature cycling and thermal shock. These actions prevent further atom diffusion and reorganization.

Suitable metals for a grain growth inhibitor may include, for example, Fe, Mn, Cr, Co, Ru, Si, V, W, Nb, Ta, Y, Zr, Hf, Be, Tl, Rh, Ir, Ti, Mo, Re, Al, alloys thereof, or any combination thereof, particularly nanoparticles comprising one or more of these metals. Si is considered to be a metal for purposes of the present disclosure. The metal particles may be metal nanoparticles or micron-scale metal particles, according to various embodiments. Nanoparticles of these metals may be particularly suitable. Other suitable grain growth inhibitors may include, for example, carbides, nitrides, borides, silicides, or phosphides. Suitable borides may include, for example, Zr/Hf, V, or Nb/Ta. Similar metals may be appropriate for carbides, nitrides, silicides and phosphides, although any of the metals above may be suitable. Other suitable phosphides may include covalent phosphides such as BP and $SiP_2$, transition metal phosphides such as $Fe_3P$, $Fe_2P$, $Ni_2P$, CrP, MnP, MoP and the like. Metal-rich phosphides such as these may be desirable due to their water insolubility, electrical conductivity, high melting points, thermal stability, hardness, and similar properties. Other suitable carbides may include covalent carbides such as BC (including $B_xC_y$ non-stoichiometric carbides) and SiC, and transition metal carbides, which similarly exhibit high melting points, hardness, electrical conductivity, and similar properties. Graphene and other nanocarbon materials may also be effective grain growth inhibitors in some cases.

Suitable grain growth inhibitors may be included in copper nanoparticle paste compositions in an amount ranging between about 0.01 wt. % to about 15 wt. % with respect to the nanoparticle paste composition or an interconnect resulting therefrom following fusion of the copper nanoparticles to form a bulk copper matrix. In more particular embodiments, the grain growth inhibitors may be present in an amount ranging between about 0.01 wt. % and about 5 wt. %, or between about 0.1 wt. % and about 0.5 wt. %. Particular copper nanoparticle paste compositions may comprise up to about 12 wt. % Al, or about 0.01-5 wt. % Zr, or 0.01-5 wt. % Zr/Hf. These particular grain growth inhibitors in the referenced amounts may provide temperature stability of up to about 940° C., 500° C. or 600° C., respectively. Aluminum may be advantageous for forming insoluble binary phases like $CuAl_2$ or $Cu_9Al_4$.

The grain growth inhibitors may be in various forms when incorporated/combined with the copper nanoparticles. In some embodiments, the grain growth inhibitors may be nanoparticles themselves, particularly having a size of about 10 nm or less. In other embodiments, the grain growth inhibitors may range between 10 nm and 100 nm in size.

When incorporated as nanoparticles, reagents for forming the grain growth inhibitors may be mixed with the reagents for forming the copper nanoparticles and then they may undergo co-reduction to form the copper nanoparticles and the grain growth inhibitors simultaneously. Suitable reagents for forming the grain growth inhibitors may include, for example, metal nitrates, chloride, bromides or iodides. The grain growth inhibitors may also constitute nanoparticle seeds for the copper nanoparticles, and then become incorporated within the resulting bulk copper matrix following copper nanoparticle fusion. Nanoparticle seeds suitable for becoming a grain growth inhibitor may be made separately and combined with the reagents for forming the copper nanoparticles, or such nanoparticle seeds may be formed concurrently with forming the copper nanoparticles. Carrier solvents may be used to disperse the reagents for forming the nanoparticle seeds/grain growth inhibitors before dispersal with the copper nanoparticles or precursors to the copper nanoparticles.

Alternately, preformed grain growth inhibitors may be mixed with preformed copper nanoparticles, either before or after formulating the copper nanoparticles into a paste formulation.

In still other alternative embodiments, a trialkylaluminum compound (e.g., trimethylaluminum) may be incorporated in the copper nanoparticle paste formulations. The trialkylaluminum may react during copper nanoparticle consolidation to release aluminum or an aluminum compound into the grain boundaries.

Still further alternately, salts that form the grain growth inhibitors following reduction may be mixed within the copper nanoparticle paste compositions and then undergo reduction to form the grain growth inhibitors during consolidation of the copper nanoparticles. Carrier solvents may be used to promote mixing with the copper nanoparticle paste formulation.

In still other embodiments, $NaReO_4$ may be formulated into a grain growth inhibitor. This salt is compatible with both aqueous and non-aqueous solvent conditions (including glyme solvent mixtures) and the same amines that may be used in forming copper nanoparticles. Reducing agents such as NaBH$_4$, CaH$_2$, hydrazine, organomagnesium or organosodium compounds, or redAl may be used to affect reduction.

Figure 3:
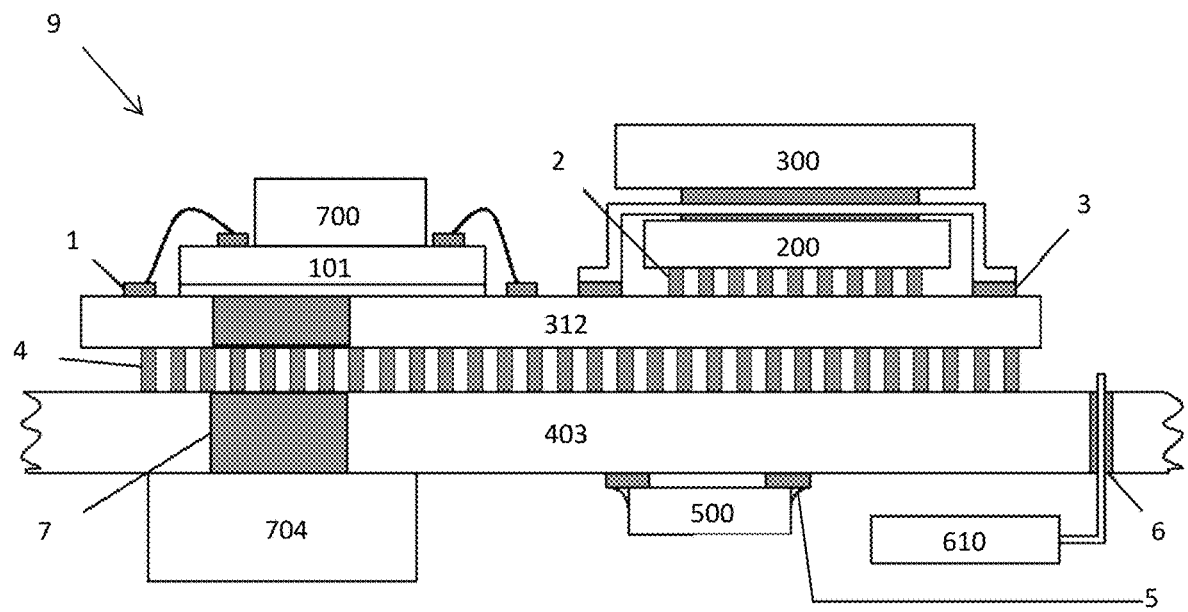
FIG. 3 shows a diagram of an illustrative electronic assembly incorporating copper interconnects in multiple locations.
Figure 16:
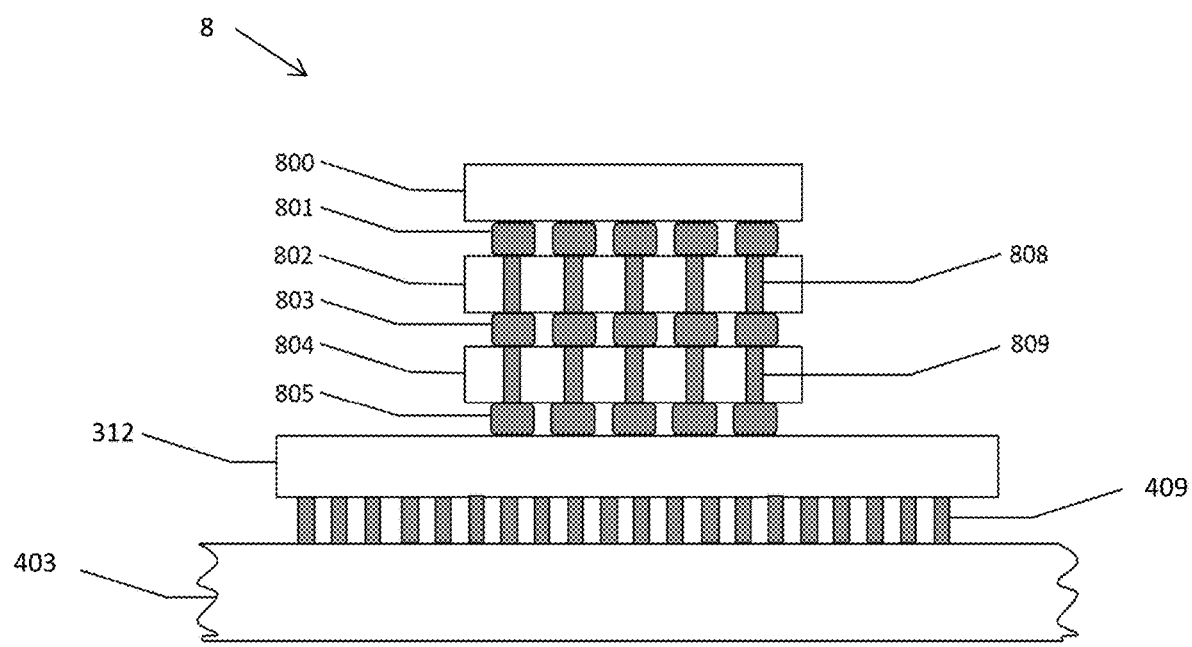
FIG. 16 shows a diagram of an illustrative three-dimensional integrated circuit (3DIC) employing a heat channel formed from fused copper nanoparticles.

Turning now to particular ACES embodiments of the present disclosure or similar electronic assemblies employing one or more copper-based interconnects, FIG. 3 shows a diagram of an illustrative electronic assembly incorporating copper interconnects in multiple locations. In FIG. 3, electronic assembly 9 includes wire bonding assembly 1 connected to die 101, flip chip connections 2 connecting IC substrate 312 to flip chip 200, hermetic seal assembly 3, connector 4 located between integrated circuit (IC) substrate 312 (an interposer) and package substrate 403 (printed circuit board (PCB)), component interconnect 5 connecting electronic component 500 to the backside of package substrate 403, through-hole copper 6 (via copper) extending to electronic component 610, and heat channel 7 connecting die 101 to heat sinks 700 and 704 located upon opposite faces of package substrate 403. Any of the foregoing structures may be fabricated from copper using the copper nanoparticle paste composition technology described herein. Depending upon location and particular operational considerations, the copper nanoparticle paste composition employed at each location may be the same or different. Moreover, a first portion of the copper in an interconnect at each location may be incorporated using molten copper metal in some cases, in combination with a second portion of the interconnect formed from fused copper nanoparticles. Techniques for incorporating copper in each of these locations is described in greater detail hereinafter. A three-dimensional stacked electronic assembly variant of electronic assembly 9 is shown in FIG. 16, which is described further below.

It is to be appreciated that electronic assembly 9 depicted in FIG. 3 is merely illustrative of electronic components that may be suitably fabricated using copper nanoparticles in a suitable fashion. That is, an actual electronic assembly may or may not incorporate all of the electronic components depicted in FIG. 3 and/or the particular arrangement of electronic components depicted in FIG. 3. Moreover, depending on particular application needs, one or more of the electronic components depicted in FIG. 3 may be duplicated in a particular example of electronic assembly 9. As such, any configuration for electronic assembly 9 incorporating one or more types of electronic components in multiple locations and comprising fused copper nanoparticles falls within the scope of the present disclosure.

Wire Bonding Assembly 1

Figure 4:
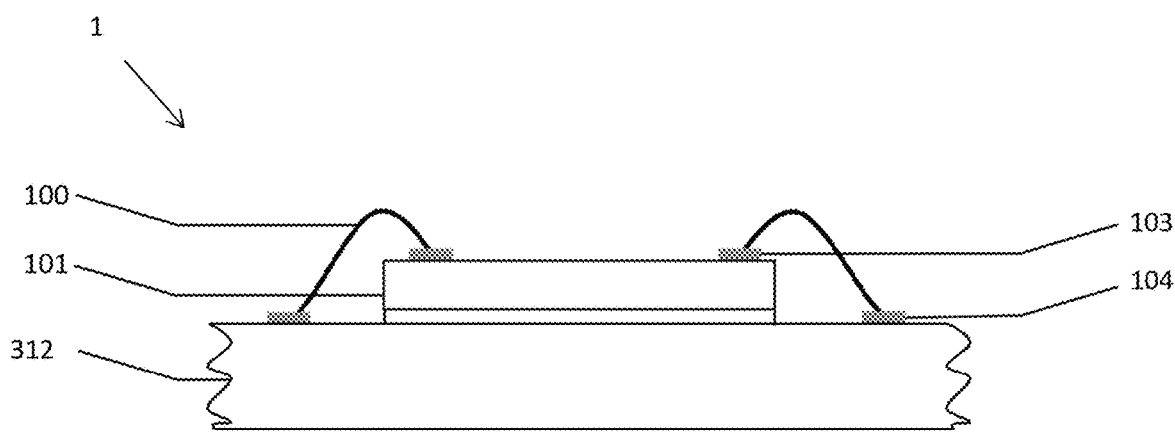
FIG. 4 shows a diagram of an illustrative wire bonding assembly employing fused copper nanoparticles for forming an interconnect.

FIG. 4 shows a diagram of an illustrative wire bonding assembly 1 employing fused copper nanoparticles for forming an interconnect. Wire bonding assembly 1 comprises die 101 joined to IC substrate 312 by copper bond wire 100. Die 101 can be made of any semiconductor material, with common examples being electronic-grade silicon and GaAs. The all-copper aspect of wire bonding assembly 1 refers to the nanocopper-based joint at die-to-wire interface 103, copper bond wire 100, and the nanocopper-based joint at wire-to-substrate interface 104. The resulting interconnect may comprise a bulk copper matrix formed from fused copper nanoparticles, which may feature a bulk copper matrix comprising at least 90% density nanocopper. A bulk copper matrix of this type may be obtained upon fusion of copper nanoparticles having a diameter about 20 nm or less, which may be provided from a suitable copper nanoparticle paste composition described herein. Copper bond wire 100 may be composed of substantially pure copper metal and have a wire diameter ranging from about 15-500 microns, depending on the electrical load requirements of electronic assembly 9.

Current methods for copper wire bonding to a chip include ball bonding and wedge bonding techniques using conventional solders. Metal diffusivity in these techniques may create Kirkendall voids over the long run. Moreover, the hardness of copper may require use of a bond force and/or an ultrasonic force to promote effective wire bonding (e.g., to flatten the ends of copper bond wire 100 at die-to-wire interface 103 and wire-to-substrate interface 104). Application of these forces may fracture a passivation layer (not shown in FIG. 4) upon IC substrate 312 and lead to potential cratering or other deleterious effects. Forming an interconnect to copper bond wire 100 at the foregoing locations using fused copper nanoparticles may aid in averting these issues.

Wire bond assembly 1 can be fabricated using any system that can hold copper bond wire 100, dispense an end of copper bond wire 100 to either of the joining surfaces at interfaces 103 or 104, and apply a temperature of about 190-240° C. to copper bond wire 100 when in contact with a copper nanoparticle paste composition at the joining surface. Hence, current wire bonding techniques and systems that provide ball bonding or wedge bonding capabilities may be suitably modified to incorporate the wire bonding techniques using copper nanoparticles described herein.

According to various embodiments, wire bond assembly 1 may be fabricated by obtaining the following: a copper nanoparticle paste composition to be used for joining at interfaces 103 and 104, copper bond wire 100 (usually with wire diameters ranging from about 15 microns to several hundred microns), die 101 made of a suitable semiconductor material, on which a functional circuit is fabricated or may be fabricated, and IC substrate 312 to connect die 101 to other electronic components, commonly a PCB. Accordingly, copper may be incorporated within wire bond assembly 1 at copper bond wire 100 and interfaces 103 and 104, with copper nanoparticles undergoing fusion to form the latter. Generally, copper bond wires 100 are provided from previously fabricated bulk copper and are not formed through fusion of copper nanoparticles.

For holding copper bond wire 100, a traditional ball or wedge bonder can be employed to support the ends of copper bond wire 100 so that work can be performed on it. Any clamp that can hold the wire end and exert a sufficient amount of pressure on it may also be used.

Before bringing an end of copper bond wire 100 to the joining surfaces at interfaces 103 and 104, some preprocessing operations may be conducted. First, the bond wire end may be coated with a layer of copper nanoparticles from a copper nanoparticle paste composition. The paste can be applied by dipping the end of copper bond wire 100 into a container of the copper nanoparticle paste composition, or be applied directly to interfaces 103 and 104 with a flat edge like a spatula or doctor's blade. To increase the strength of the interconnect resulting from the fusion process, the wire tip can be flattened out for a greater contact area at interfaces 103 and 104. Flattening can be performed by using a clamp on a bonder apparatus to apply enough pressure on the tip to flatten it out. After flattening, the clamp may be adjusted to hold copper bond wire 100 at a different position so the application of copper nanoparticles can take place thereon and/or upon interfaces 103 and 104.

One end of copper bond wire 100 is then placed onto die 101, which may comprise silicon or another suitable semiconductor material. In particular, a bonding pad (not shown)

may be present upon die 101 to promote robust bonding with copper bond wire 101. Heat can then be applied to the area where the end of copper bond wire 100 is incident on the surface of die 101, typically at a temperature of about 190-240° C. An interconnect comprising a bulk copper matrix then forms at interface 103. Thereafter, the other end of copper bond wire 100 is placed onto IC substrate 312. Heat can then be applied to the area of contact, typically at a temperature of about 190-240° C. An interconnect comprising bulk copper then forms at interface 104. The order of forming interconnects at interfaces 103 and 104 may be reversed from the order presented. If needed, the joining process at either location may be conducted within an inert atmosphere to limit oxidation of copper bond wire 100 and the fused copper nanoparticles defining interfaces 103 and 104.

There are multiple techniques suitable to heat the joint area at interfaces 103 and 104 so that the copper nanoparticles can undergo fusion in each location, thereby creating an interconnect between copper bond wire 100 and a bulk copper matrix formed from copper nanoparticles that promotes adherence to the corresponding surfaces at each location. One suitable technique is laser spot welding. In this process, a laser is directed at the copper nanocopper paste composition at each location, and energy is transferred to the surface upon which the laser is incident, thereby heating the copper nanoparticles up to a temperature where fusion occurs. Following nanoparticle fusion, a spot comprising a bulk copper matrix and having a spot diameter ranging from about 0.1 mm to about 2.0 mm results. A second suitable technique is resistive spot welding. In this process, two electrodes connected to a high-current source are brought to either side of a surface having copper nanoparticles deposited thereon. A high current is then passed through the copper nanoparticles after activating the electrodes. Heating results through electrical resistance as current passes through the copper nanoparticles. Once the temperature reaches a level sufficient for copper nanoparticle fusion to occur, a spot comprising a bulk copper matrix may be formed. A third suitable technique is pulsed light photosintering. In this process, the copper nanoparticles deposited in each location are illuminated by high-energy peak pulses for several milliseconds. This action rapidly heats up the copper nanoparticles to their fusion temperature, allowing formation of an interconnect comprising a bulk copper matrix to be formed. A final technique that may be suitable for promoting nanoparticle fusion is ultrasonic welding. In this process, the clamp holding copper bond wire 100 is capable of ultrasonic vibration, such that the bond wire tip can vibrate at ultrasonic frequency when brought to the surface for joining. In this case, energy transfer from the ultrasonic vibration causes heating of the copper nanoparticle up to the required temperature to promote fusion to form interfaces 103 and 104. If the clamp itself is incapable of ultrasonic vibration, a small external contact capable of ultrasonic vibration can be brought into contact with the end of copper bonding wire 100 and the copper nanoparticles. This approach also allows heating up to the fusion temperature through absorption of ultrasonic vibrations to be realized as well.

Additional details concerning wire bonding using metal nanoparticles, particularly copper nanoparticles, may be found in U.S. Pat. No. 9,881,895, which is incorporated herein by reference in its entirety. It is to be noted that through the use of copper nanoparticles, the fusion temperature, pressure requirements and heating duration may be lower or shorter than in conventional wire bonding methods. Hence, the time needed to form wire bond assembly 1 is projected to be better than the current conventional methods of ball and wedge bonding. The wire bonding methods may further avoid Kirkendall voids and are less likely to crack IC substrate 312.

Flip Chip Connections 2

Figure 5:
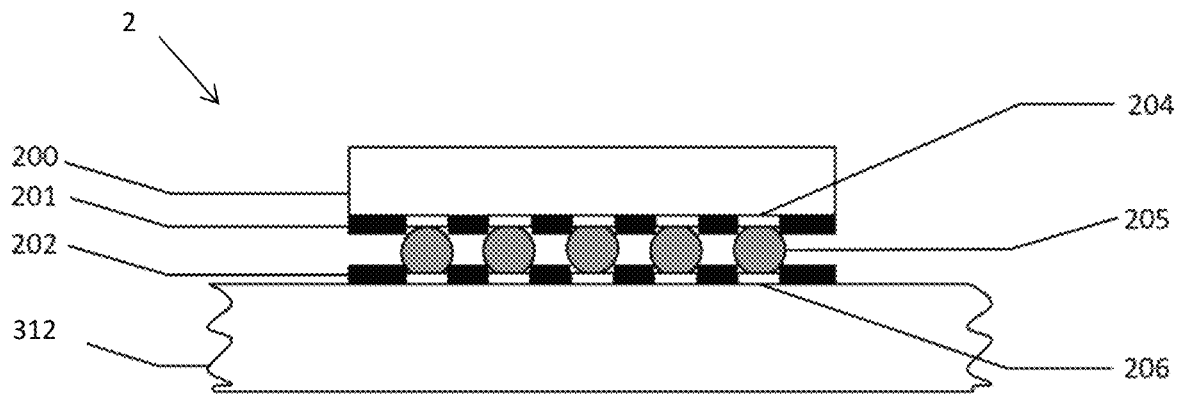
FIGS. 5 and 6 show diagrams of two illustrative configurations for a flip chip connection employing fused copper nanoparticles for forming an interconnect.
Figure 6:
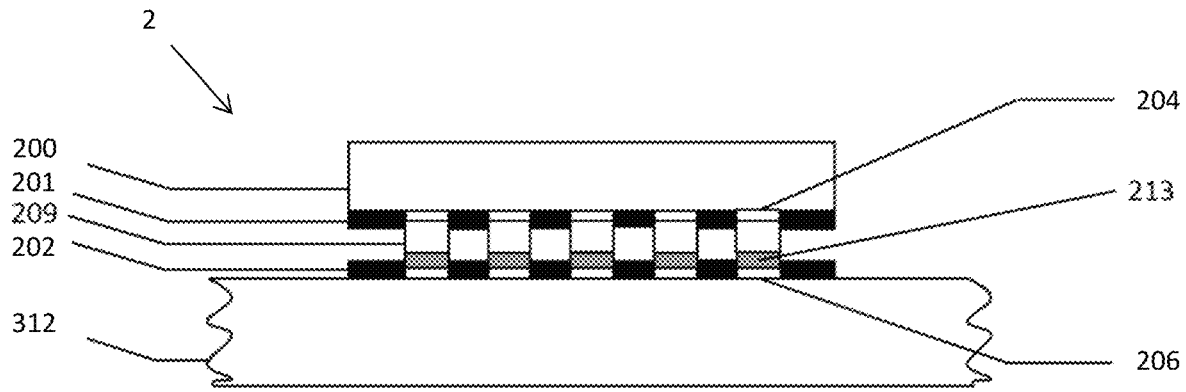

FIGS. 5 and 6 show diagrams of two illustrative configurations for flip chip connections 2, each employing fused copper nanoparticles for forming an interconnect. FIG. 5 shows a direct connection flip chip, and FIG. 6 shows a flip chip connection formed from copper pillars.

Referring to FIG. 5, flip chip connection 2 comprises flip chip 200, which includes an integrated circuit component mounted on a chip. The active surface of flip chip 200 includes a plurality of Under Bump Metallization (UBM) contacts 204, which connect to one end of copper nanoparticle joint 205. UBM contacts 204 are separated from each other by a passivation/solder resist layer 201, which may be made of silicon nitride or epoxy in non-limiting examples. The other end of copper nanoparticle joint 205 connects to copper pads 206 on the surface of IC substrate (interposer) 312. Copper pads 206 are separated from each other by passivation/solder resist layer 202, which may be made of silicon nitride or epoxy in non-limiting examples. The all-copper aspect of flip chip connection 2 refers to the connection of UBM contacts 204 on flip chip 200 to copper nanoparticle joint 205 and to copper pads 206 on IC substrate 312. Copper nanoparticle joint 205 may comprise a bulk copper matrix formed from fused copper nanoparticles and comprise at least 90% density nanocopper. The bulk copper matrix may be formed through fusion of copper nanoparticles with diameter of less than about 20 nm or less than about 70 nm.

With further reference to FIG. 5, fabrication may be performed by first obtaining flip chip 200 and obtaining or forming IC substrate 312 with a plurality of copper pads 206 thereon. After obtaining a suitable copper nanoparticle paste composition, the paste composition is applied onto copper pads 206, thereby forming a nanocopper coating upon copper pads 206. Flip chip 200 is then placed upon the nanocopper coating upon copper pads 206, such that the copper nanoparticle paste composition interfaces with flip chip 200. If necessary, a temporary supporting structure may be used to hold the assembly in place prior to nanoparticle fusion. The assembly is then moved through a reflow oven at a temperature of about 190-240° C. for a predetermined time, thereby causing the copper nanoparticles within the paste composition to undergo solid-state sintering and solidification. Joint 205, defining an interconnect between flip chip 200 and IC substrate 312, is formed through the heating process to form fused copper nanoparticles and may be composed of at least 90% density bulk copper.

Turning now to the configuration of FIG. 6, flip chip connection 2 comprises flip chip 200, which is an integrated circuit component mounted on a chip. The active surface of flip chip 200 includes a plurality of Under Bump Metallization (UBM) contacts 204, which connect to one end of copper pillars 209, which may be cylindrical in shape. Copper pillars 209 used in flip chip connection 2 are able to achieve a fine pitch down to about 10 μm or even down to 1 μm in some cases, typically in the 1 μm to about 10 μm range. UBM contacts 204 are separated from each other by passivation/solder resist layer 201, which may be made of silicon nitride or epoxy in non-limiting examples. The other end of copper pillars 209 connect by interconnect 213 to copper pads 206 on the surface of IC substrate 312. Interconnect 213 may be formed from fused copper nanoparticles. Copper pads 206 are separated from each other by passivation/solder resist layer 202, which may be made of silicon nitride or epoxy in non-limiting examples. The all-copper aspect of this configuration of flip chip connection 2 refers to the connection from UBM contacts 204 on flip chip 20, copper pillars 209, interconnect 213, and copper pads 206 on IC substrate 312. Interconnect 213 may comprise a bulk copper matrix comprising fused copper nanoparticles featuring at least 90% density nanocopper. The bulk copper matrix may be prepared through fusion of copper nanoparticles with a diameter less than about 20 nm or less than about 70 nm.

Processing conditions for the second configuration of flip chip connection 2 will now be described in further detail in reference to FIGS. 6 and 7. In non-limiting embodiments, copper pillars 209 on flip chip 200 may be formed by stencil photolithography. The active surface of flip chip 200 may be coated with a layer of photoresist 217 and masked with a pattern corresponding to the position to be occupied by copper pillars 209 and UBM contacts 206. Upon exposure to UV light or another form of electromagnetic radiation suitable to form holes in the layer of photoresist 217, the positions of copper pillars 209 are defined. The remaining photoresist 217 provides a stencil for deposition of a copper nanoparticle paste composition upon UBM contacts 206, as described next.

Figure 7:
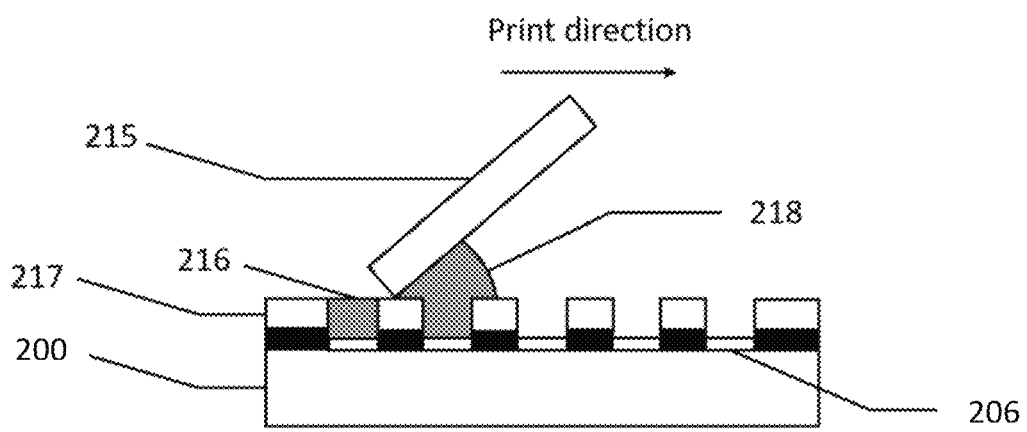
FIG. 7 shows a diagram of an illustrative process for producing a flip chip connection using copper nanoparticles.

Referring still to FIG. 7, squeegee 215 or a similar device may spread (print) copper nanoparticle paste composition 218 across the surface of photoresist 217 in the print direction, thereby filling the holes defined in photoresist 217 with deposited copper nanoparticle paste composition 216. Typical print speeds for such operations may range from about 20-80 mm per second. Flip chip 200 with deposited copper nanoparticle paste composition 216 coated thereon is then heated for a predetermined time at a temperature of about 190-240° C. to cause the copper nanoparticles to undergo solid-state sintering and solidification into copper pillars 209 comprising a bulk copper matrix comprising at least 90% density fused copper nanoparticles. Photoresist 217 may then be removed with solvents such as methoxy-propyl acetate, or any other suitable solvent or by dry etching. Suitable solvents may include those that are capable of dissolving photoresist 217 but not dissolving or damaging flip chip 200 or any components thereon. Copper pillars 209 produced by this technique are able to achieve fine pitch down to about 10 µm or even down to about 1 µm, typically in the 1 µm to about 10 µm range.

Referring again to FIG. 6, assembly of flip chip connection 2 may be completed in a number of different ways, as described hereinafter. In a first assembly process, assembly may be performed by first obtaining an IC substrate 312 with a plurality of copper pads 206 defined thereon. Next, flip chip 200 including copper pillars 209 is obtained, such as through the process outlined above. Thereafter, a copper nanoparticle paste composition is applied onto copper pads 206, thereby forming a copper nanoparticle layer upon copper pads 206. Flip chip 200 is then placed on the coated copper pads 206, such that the copper nanoparticle paste composition interfaces between copper pads 206 and copper pillars 209. If necessary, a temporary supporting structure may be used to hold the assembly in place prior to copper nanoparticle fusion. The assembly may then move through a reflow oven at a temperature of about 190-240° C. for a predetermined time to cause the copper nanoparticles to undergo solid-state sintering and solidification into a bulk copper matrix. A solid joint is formed as interconnect 213 between copper pads 206 and copper pillars 209 and comprises a bulk copper matrix comprising at least 90% density fused nanocopper. After nanoparticle fusion occurs, the interface between copper pads 206, interconnect 213 and copper pillars 209 may be seamless as the copper surface at each location become bonded to one another.

In a second assembly process, IC substrate 312 is obtained with a plurality of copper pads 206 defined thereon. Optionally, copper pads 206 may be coated with an organic solderability preservative (OSP) layer for oxidation protection. Next, flip chip 200 including copper pillars 209 is obtained, such as through the process outlined above. A horizontal tray, such as with a shallow platform, may then be used to hold the copper nanoparticle paste composition for application to copper pillars 209. The thickness of the copper nanoparticle paste composition on the tray may be controlled by a doctor blade or similar structure which moves horizontally across the tray surface, with a well-defined gap size of the blade to the surface being used. After orientating flip chip 200 with copper pillars 209 being disposed horizontally, flip chip 200 may then be lowered vertically until the tips of copper pillars 209 are dipped into the copper nanoparticle paste composition, such that copper nanoparticles are transferred onto the tips of copper pillars 209. Flip chip 200 is then lifted off the tray vertically and positioned such that copper pillars 209 with copper nanoparticle paste composition thereon are placed on copper pads 206 of IC substrate 312, such that the copper nanoparticles interface with copper pads 206. If necessary, a temporary supporting structure may be used to hold the assembly in place prior to nanoparticle fusion. The assembly may then move through a reflow oven at a temperature of about 190-240° C. for a predetermined time to cause the copper nanoparticles to undergo solid-state sintering and solidification into a bulk copper matrix. A solid joint is formed as interconnect 213 between copper pads 206 and copper pillars 209 and comprises a bulk copper matrix comprising at least 90% density fused nanocopper.

Hermetic Seal Assembly 3

Figure 8:
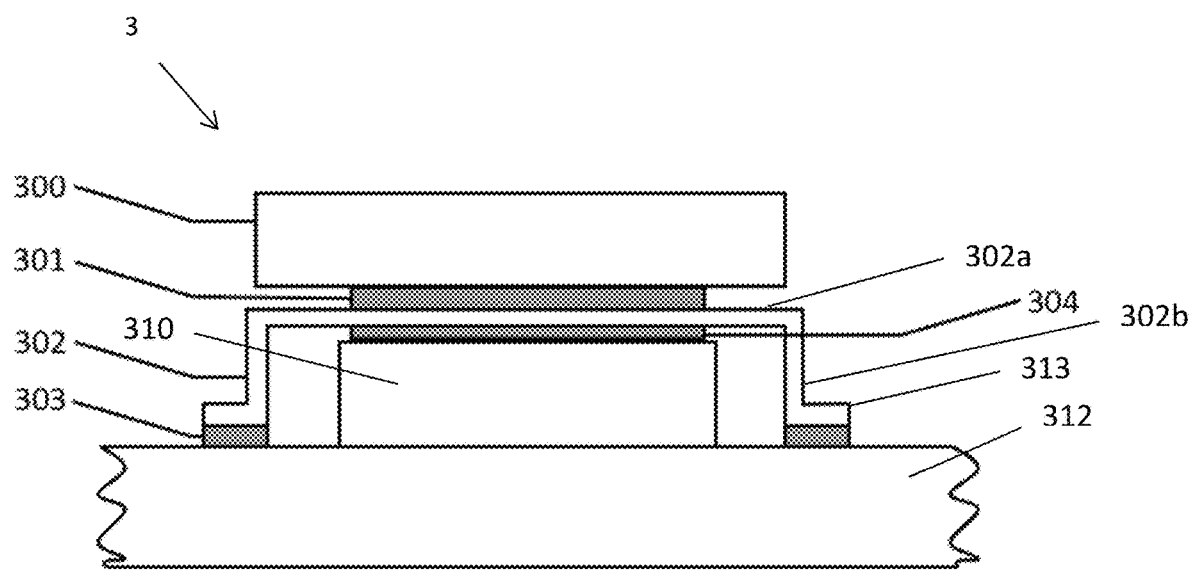
FIG. 8 shows a diagram of an illustrative hermetic seal assembly employing fused copper nanoparticles for forming an interconnect.

FIG. 8 shows a diagram of an illustrative hermetic seal assembly employing fused copper nanoparticles for forming an interconnect. Hermetic seal assembly 3 comprises electronic component 310 and nanocopper seal 303, in which nanocopper seal 303 is formed at least in part from fused copper nanoparticles. Electronic component 310 is disposed upon IC substrate 312. Hermetic seal lid 302 partially surrounds electronic component 310, such that electronic component 310 is interposed between hermetic seal lid 302 and IC substrate 312. Hermetic seal lid 302 may be formed from copper or another highly conductive material. When formed from copper, hermetic seal lid 302 may comprise a previously formed bulk copper material. In general, hermetic seal lid 302 is not formed from copper nanoparticles.

Referring still to FIG. 8, hermetic seal lid 302 comprises generally horizontal surface 302a disposed over electronic component 310 and non-horizontal surface 302b surrounding the sides of electronic component 310. As depicted, non-horizontal surface 302b is substantially vertical, but it is to be appreciated that non-horizontal surface 302b may be sloped or similarly non-vertically oriented while still effectively surrounding electronic component 310. Hermetic seal lid 302 is joined to IC substrate 312 via nanocopper seal 303, wherein nanocopper seal 303 is formed from fused copper nanoparticles and defines an interconnect disposed between IC substrate 312 and mounting surface 313 upon hermetic seal lid 302, which is contiguous with non-horizontal surface 302b. Fusion of the copper nanoparticles in this location is described in further detail below.

Optionally, one or more thin layers comprising a thermal interface material (TIM) formed from copper nanoparticles may be incorporated to improve heat transfer through hermetic seal lid 302. Specifically, copper nanoparticles in the form of a copper nanoparticle paste composition may be deposited and fused to form interfaces 301 and/or 304, thereby creating a continuous thermally conducting pathway from electronic component 310 through hermetic seal lid 302 to heat sink 300. Interface 301 is interposed between heat sink 300 and hermetic seal lid 302, and interface 304 is interposed between hermetic seal lid 302 and electronic component 310. The all-copper aspect of hermetic seal assembly 3 refers to the thermal interface layers comprising interfaces 301 and 304, hermetic seal lid 302 comprising copper, and nanocopper seal 303. With precision manufacturing, hermetic seal lid 302 may be in direct contact with electronic component 310 and heat sink 300, in which case the all-copper aspect of hermetic seal assembly 3 may refer to hermetic seal lid 302 comprising copper and nanocopper seal 303 providing hermetic sealing. That is, in some embodiments, interfaces 301 and 304 may be optional components of hermetic seal assembly. Preferably, interfaces 301 and 304 are present to improve thermal conductivity through hermetic seal lid.

Nanocopper seal 303 may be composed of a bulk copper matrix comprising at least 90% density bulk copper following copper nanoparticle fusion. The copper nanoparticles undergoing fusion in this location may have a diameter less than about 20 nm or less than about 70 nm. The width of hermetic seal lid 302 can range from about 0.5 mm or about 1 mm to about 600 mm, depending on the size of electronic component 310 surrounded therewith. As pure copper is corrosion prone, hermetic seal lid 302 may be made of a non-copper material or a copper alloy that is more corrosion resistant than is pure copper, such as BeCu or CuW alloys.

When present, the TIM layers at interfaces 301 and 304 may be restricted to a maximum thickness of about 0.1 mm for promoting optimal thermal conductivity. The TIM layers at interfaces 301 and 304 may, in some embodiments, be composed of a nanocopper gasket material, which may comprise a compliant substance comprising copper nanoparticles or a reaction product thereof. Suitable reaction products formed from copper nanoparticles may be formed by heating surfactant-coated copper nanoparticles having a composition described herein in the presence of one or more carboxylic acids and one or more amines. Additional details of such compliant copper-containing substances are described in U.S. Patent Application Publication 2014/0374079, which is incorporated herein by reference in its entirety. The nanocopper gasket material may be adhered onto the top surface of electronic component 310 and the bottom surface of hermetic seal lid 302 to define interface 304, and to top surface 302a of hermetic seal lid 302 and the bottom surface of heat sink 300 to define interface 301. The nanocopper gasket material may display good thermal conductivity, although its electrical conductivity may be lower than that of a bulk copper matrix formed through fusion of copper nanoparticles.

Assembly of hermetic seal assembly 3 may be completed by any system that is able to distribute the copper nanoparticle paste composition where mounting surface 313 contacts IC substrate 312 to form nanocopper seal 303 as a hermetic joint following nanoparticle fusion. The system may further heat the copper nanoparticle paste composition until the temperature is about 190-240° C., and/or apply a copper nanoparticle paste composition or a reaction product formed from copper nanoparticles in a thin layer at one or more or interfaces 301 and 304.

In some embodiments, production of hermetic seal assembly 3 and related components may be accomplished by obtaining a copper-based hermetic seal lid 302, IC substrate 312 having any electronic component 310 disposed thereon and in need of hermetic sealing, an amount of copper nanoparticle paste composition needed to promote formation of nanocopper seal 303, and a nanocopper gasket material for formation of interfaces 301 and 304. Once the individual components are obtained, formation of hermetic seal assembly 3 may proceed by applying the copper nanoparticle paste composition to mounting surface 313, applying the nanocopper gasket material on electronic component 310 before it is surrounded by hermetic seal lid 302, and then locally heating so that the copper nanoparticle paste composition solidifies into a bulk copper matrix at nanocopper seal 303 (e.g., at 190-240° C. for appreciable fusion speed). Thereafter, a thin layer of the nanocopper gasket material may be applied on a top surface of hermetic seal lid 302 for contacting heat sink 300. In this case, moderate pressure may be applied easily and safely to ensure formation of a good hermetic seal and bonding contact between heat sink 300 and hermetic seal lid 302 through interface 301.

Applying the copper nanoparticle paste composition to mounting surface 313 for joining hermetic seal lid 302 to IC substrate 312 may take place by any of three methods. A first method involves turning the joining edge of mounting surface 313 upward, and applying the copper nanoparticle paste composition with a roller, so that the paste is spread evenly along the joining edge. Hermetic seal lid 302 may then be flipped and placed onto IC substrate 312, thereby encasing electronic component 310 following copper nanoparticle fusion. A second method involves placing the copper nanoparticle paste composition onto a large tray. A doctor blade or similar edged tool may then spread the copper nanoparticle paste composition at a substantially uniform thickness across the tray, wherein a thickness of the thin layer is just enough to coat the joining edge of mounting surface 313 of hermetic seal lid 302. Hermetic seal lid 302 is then dipped into the tray and placed onto IC substrate 312, thereby affording hermetic sealing following copper nanoparticle fusion. A third method involves using a clamp or locking mechanism to hold hermetic seal lid 302 at a desired position on IC substrate 312. The copper nanoparticle paste composition can then be extruded onto the edge of mounting surface 313, either through an extrusion bladder, or by syringe injection. Regardless of which application technique is used, fusion to form nanocopper seal 303 between hermetic seal lid 302 and IC substrate 312 may then take place to afford a bulk copper matrix formed from fused copper nanoparticles. A sealing medium may be applied in between the edge gap of hermetic seal lid 302 and IC substrate 312 to further enhance the quality of the resulting hermetic seal.

In the second joining process described above, the distance between the inner face of the top surface of hermetic seal lid 302 (i.e., the inner face of generally horizontal surface 302a) and the top surface of electronic component 310 may be calculated or measured, such that the correct thickness of the TIM may be applied when forming interface 304 before encasing electronic component 310 with hermetic seal lid 302. A nanocopper gasket material may be originally encased in cellophane tape or a similar protective covering prior to being deposited at interface 304. Removal of the cellophane tape or similar protective covering may reveal an adhesive surface for adherence to the top surface of electronic component 310 prior to placement of hermetic seal lid 302 upon IC substrate 312. Some application pressure may be used to make good thermal contact between the nanocopper gasket material and the inner face of generally horizontal surface 302a of hermetic seal lid 302 and the top surface of electronic component 310.

The third joining process is similar to that of the second joining process. In this case, however, there is no particular need for careful measurement of the thickness of the TIM at interface 304. Instead, the TIM may be set according to the manufacturing criterion and system specifications. A nanocopper gasket material of appropriate thickness may be first adhered onto the inner face of generally horizontal surface 302a of hermetic seal lid 302. Thereafter, heat sink 300 can be placed onto the top face of hermetic seal lid 302 to form a continuous thermal conduction pathway. Interface 301 may or may not be present in this instance.

In more specific embodiments of the third joining process, two different methods may be used to promote heating at the joint defining nanocopper hermetic seal 303. The first method involves laser spot welding. In this process, a laser may be directed at the copper nanoparticle paste composition beneath mounting surface 313, thereby creating a heated spot with diameter ranging from about 0.1 mm to about 2.0 mm. Energy is transferred to the spot at the location of laser incidence, thereby heating the spot up to the temperature where nanoparticle fusion occurs. The laser may then be re-directed to an adjacent spot along the edge of the original spot. This action may be repeated to create a series of overlapping spots along a joining edge, thereby creating nanocopper seal 303 comprising a bulk copper matrix.

Figure 9:
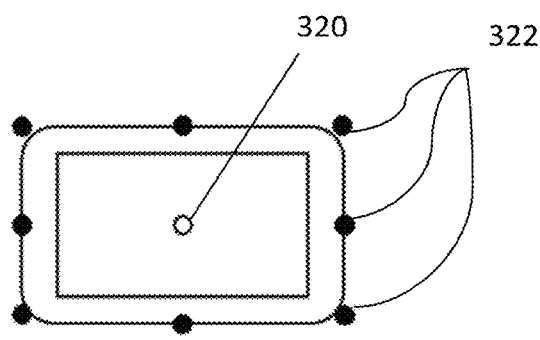
FIG. 9 shows a top view of the illustrative hermetic seal assembly of FIG. 8, in which a resistive spot welding process is used to promote fusion of copper nanoparticles.

A second method applicable to the third joining process involves resistive spot welding, as further detailed in FIG. 9. FIG. 9 shows a top view of hermetic seal assembly 3 from FIG. 8, in which heat sink 300 and interface 301 have been omitted for clarity of description. In this process, positive electrode 320 is placed on the top surface of hermetic seal lid 302. Negative electrodes 322 are placed around the perimeter of hermetic seal lid 302, particularly upon the top face of mounting surface 313. A strong current directed through positive electrode 320 and negative electrodes 322 may provide resistive heating sufficient to promote nanoparticle fusion to form an interconnect comprising a bulk copper matrix and defining nanocopper seal 303.

Connector 4 Between Package Substrate (PCB) 403 and IC Substrate 312

Figure 10:
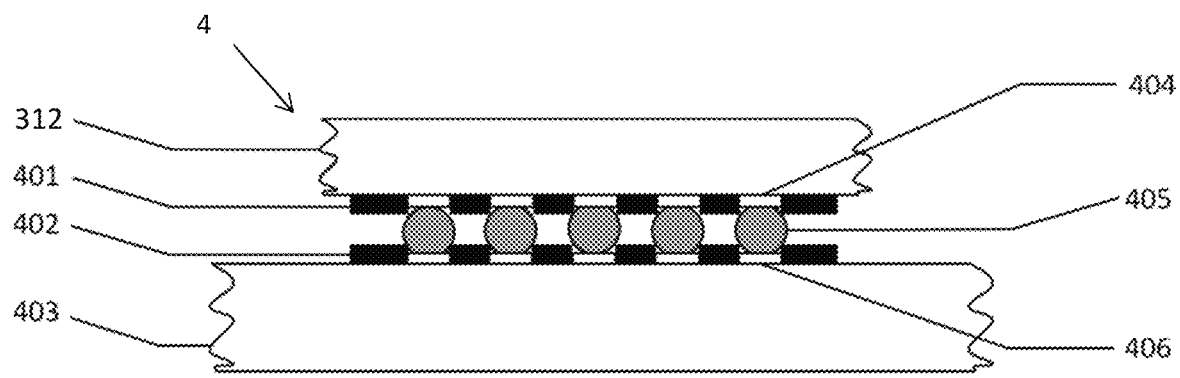
FIGS. 10 and 11 show diagrams of two illustrative configurations for an interconnect between an IC substrate and a package substrate in an electronic assembly, in which the interconnect is formed from fused copper nanoparticles.
Figure 11:
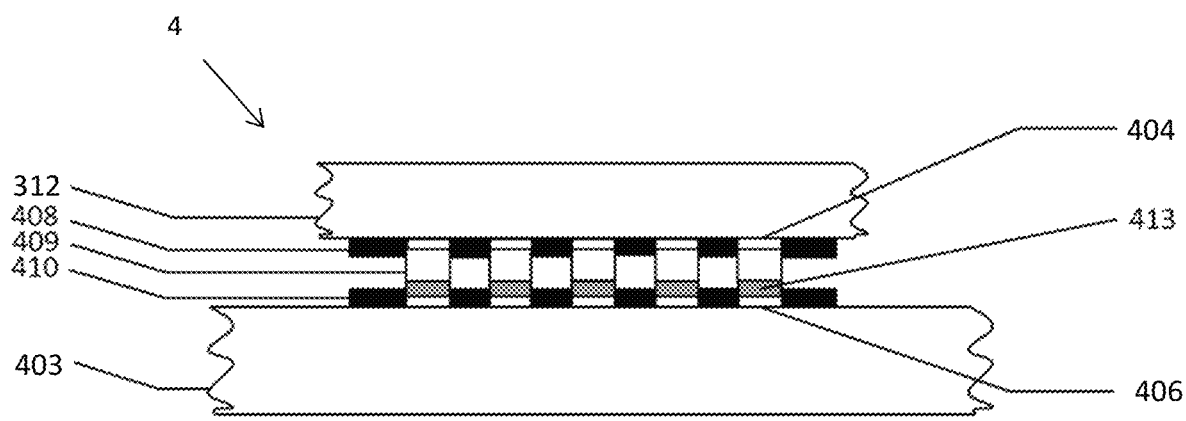

FIGS. 10 and 11 show diagrams of two illustrative configurations for connector 4 between package substrate 403 and IC substrate 312. Each connector 4 may be formed from fused copper nanoparticles. FIG. 10 shows a direct connection between package substrate 403 and IC substrate 312, and FIG. 11 shows a printed circuit board connection with copper pillars joining package substrate 403 and IC substrate 312.

Referring to FIG. 10, connector 4 is present adjacent to IC substrate (interposer) 312. The bottom-side active surface of IC substrate 312 includes a plurality of Under Bump Metallization (UBM) contacts 404, which connect to one end of nanocopper joint 405 comprising a bulk copper matrix formed through fusion of copper nanoparticles. Nanocopper joint 405 may be spherical. UBM contacts 404 are separated from each other by passivation/solder resist layer 401, which may be made of silicon nitride or epoxy, as non-limiting examples. The other end of nanocopper joint 405 connects to copper pads 406 on the top surface of package substrate (PCB) 403. Copper pads 406 are separated from each other by passivation/solder resist layer 402, which may be made of silicon nitride or epoxy, as non-limiting examples. The material comprising passivation/solder resist layers 401 and 402 may be the same or different. Nanocopper joint 405 may comprise a bulk copper matrix comprising at least 90% density fused copper nanoparticles, wherein the copper nanoparticles may have a diameter of about 20 nm or less or about 70 nm or less prior to fusion.

With further reference to FIG. 10, assembly of connector 4 may be performed by first obtaining package substrate 403 with a plurality of copper pads 406 defined thereon or being subsequently added. Next, IC substrate 312 is obtained. After obtaining a copper nanoparticle paste composition, the paste composition is applied onto copper pads 406, thereby forming a nanocopper coating upon copper pads 406. IC substrate 312 is then placed on the nanocopper coating upon copper pads 406, such that the copper nanoparticle paste composition upon copper pads 406 interfaces with IC substrate 312 via UBM contacts 404. If necessary, a temporary supporting structure may be used to hold the assembly in place prior to nanoparticle fusion. The assembly may then be moved through a reflow oven at a temperature of about 190-240° C. for a predetermined time sufficient to cause the copper nanoparticles to undergo solid-state sintering and solidification. Nanocopper joint 405 comprising a bulk copper matrix comprising at least 90% density fused nanocopper may be obtained. The all-copper aspect of this configuration of connector 4 refers to nanocopper joints 405, each connected to UBM contacts 404 on IC substrate 312 and to copper pads 406 on package substrate 403.

Referring to the second configuration for connector 4 shown in FIG. 11, connector 4 is again present adjacent to IC substrate 312 and package substrate 403. The bottom-side active surface of IC substrate 312 again includes a plurality of Under Bump Metallization (UBM) contacts 404, which connect to one end of copper pillars 409, which may be substantially cylindrical in shape. Copper pillars 409 in this configuration may achieve a fine pitch down to about 10 μm or even down to about 1 μm, typically in the 1 μm to about 10 μm range. UBM contacts 404 are separated from each other by a passivation/solder mask layer 408, which may be made of silicon nitride or epoxy, as non-limiting examples. Mask layer 408 may protect adjacent copper traces from oxidation and allow higher power traces to be placed closer together. The other end of copper pillars 409 are connected to copper pads 406 on the surface of package substrate 403 by nanocopper interconnects 413. Copper pads 406 are separated from each other by passivation/solder resist layer 410, which may be made of silicon nitride or epoxy, as non-limiting examples. Passivation/solder resist layers 408 and 410 may be compositionally the same or differ in composition. The all-copper aspect of this configuration of connector 4 refers to the connection from UBM contacts 404 on the bottom face of IC substrate 312 to copper pillars 409, copper pillars 409 themselves, nanocopper interconnects 413, and copper pads 406 on package substrate 403. Nanocopper interconnects 413 may contain a bulk copper matrix formed from fused copper nanoparticles and comprising at least 90% density nanocopper following nanoparticle fusion. The bulk copper matrix may be formed from copper nanoparticles having a diameter of about 20 nm or less or about 70 nm or less.

Figure 12:
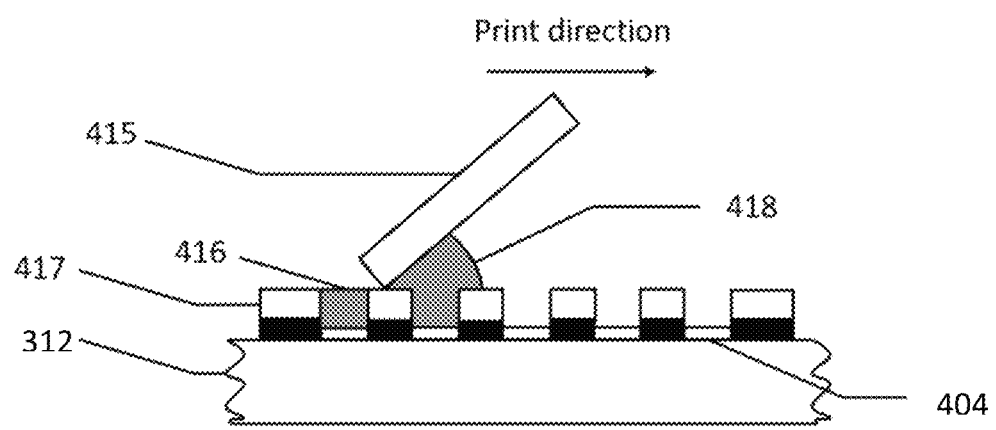
FIG. 12 shows a diagram of an illustrative process for producing an interconnect between an IC substrate and a package substrate in an electronic assembly using copper nanoparticles.

Formation of connector 4 may take place as outlined in FIG. 12 when forming connector 4 with copper pillars 409. As shown in FIG. 12 and with continued reference to FIG. 11, copper pillars 409 may be formed on UBM contacts 404 upon IC substrate 312 through stencil photolithography. The surface of IC substrate 312 is coated with a layer of photoresist 417 and masked with a pattern corresponding to the position of copper pillars 409 and UBM contacts 404. Upon exposure to UV light or another suitable form of electromagnetic radiation capable of forming holes in photoresist 417, the residual photoresist 417 may remain in a form of a photoresist stencil.

Thereafter, squeegee 415 or a similar structure may print or spread copper nanoparticle paste composition 418 across the photoresist stencil in the print direction, thereby filling up the holes at locations 416, wherein copper nanoparticle paste composition 418 is in contact with UBM contacts 404 once disposed within the holes. Typical spreading or print speeds for such operations may range from about 20-80 mm per second. Copper nanoparticle paste composition 418 within the holes is then heated for a predetermined time at a temperature of about 190-240° C. to cause the copper nanoparticles to undergo solid-state sintering and solidification into a bulk copper matrix to define copper pillars 409.

The photoresist is then removed by solvents such as methoxypropyl acetate or any other solvent capable of dissolving the photoresist material or by dry etching. Copper pillars 409 produced by this method are able to achieve a fine pitch down to about 1 µm, typically in the 1 µm to about 10 µm range.

Connector 4 may be made in the second configuration (FIG. 11), in some embodiments, by first obtaining package substrate 403 with a plurality of copper pads 406 defined thereon, and obtaining IC substrate 312 having copper pillars 409 defined thereon, such as through the technique outlined above. A copper nanoparticle paste composition is then applied onto copper pads 406, thereby forming nanocopper-covered copper pads. IC substrate 312 is then placed on the nanocopper-covered copper pads of package substrate 403, such that the copper nanoparticle paste composition interfaces with copper pillars 409 of IC substrate 312. If necessary, a temporary supporting structure may be used to hold the assembly in place prior to nanoparticle fusion. The assembly is then moved through a reflow oven at a temperature of about 190-240° C. for a predetermined time to cause the copper nanoparticles to undergo solid-state sintering and solidification to form a bulk copper matrix. A solid joint comprising interconnect 413 is formed during this process, which comprises at least 90% density nanocopper.

Alternately, copper pillars 409 may be made through alternative processes, such as electroplating or sputtering. Copper pillars formed in this fashion may be included in other configurations of connector 4, in which all the other noted components are formed from fused copper nanoparticles.

In alternate embodiments to form connector 4 in the second configuration (FIG. 11), package substrate 403 may be obtained with a plurality of copper pads 406 defined thereon, and IC substrate 312 may be obtained with a plurality of complementary copper pillars 409 defined thereon. A horizontal tray, having a shallow platform, is then used to hold a quantity of the copper nanoparticle paste composition. The thickness of the copper nanoparticle paste composition in the tray may be controlled by a doctor blade or similar structure which moves horizontally across the surface of the tray, with a well-defined gap size of the blade relative to the surface. After positioning IC substrate 312 with copper pillars 409 oriented horizontally, IC substrate 312 is then lowered vertically until the tips of copper pillars 409 are dipped into the copper nanoparticle paste composition and the copper nanoparticle paste composition is transferred onto the tips of copper pillars 409. IC substrate 312 with the copper nanoparticle paste composition thereon is then lifted off vertically and positioned such that copper pillars 409 with copper nanoparticle paste composition thereon are placed on a complementary copper pad 406 upon package substrate 403, such that the copper nanoparticle paste composition interfaces with each of copper pads 406. If necessary, a temporary supporting structure may be used to hold the assembly in place prior to nanoparticle fusion. The assembly is then moved through a reflow oven at a temperature of about 190-240° C. for a predetermined time, to cause the copper nanoparticles to undergo solid-state sintering and solidification to form a bulk copper matrix. A solid joint defining interconnect 413 is formed during this process, which comprises at least 90% density nanocopper.

Component Interconnect 5

Figure 13:
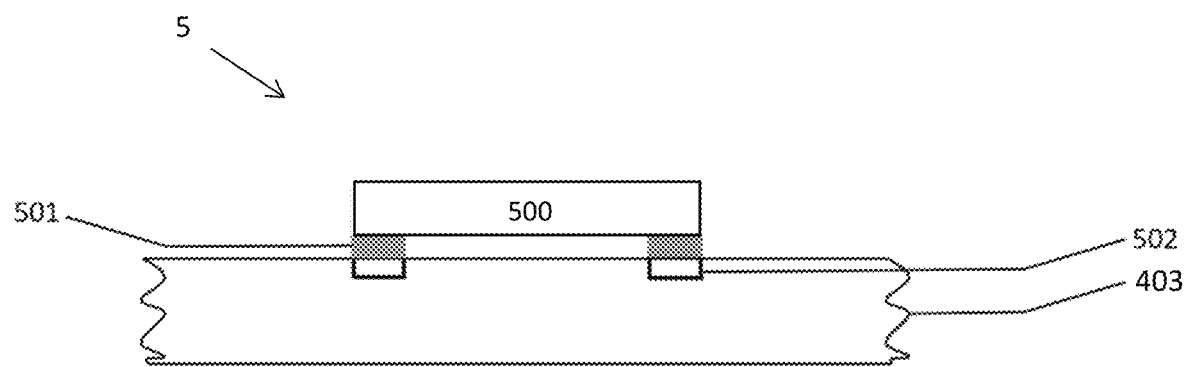
FIG. 13 shows a diagram of an illustrative component interconnect formed from fused copper nanoparticles.

FIG. 13 shows a diagram of an illustrative component interconnect formed from fused copper nanoparticles. As shown in FIG. 13, component interconnect 5 includes electronic component 500 mounted onto copper pad 502 on the surface of package substrate (PCB) 403. Although shown as a top-mount configuration in FIG. 13, backside mounting (i.e., opposite wire bonding assembly 1 and similar components) may equivalently occur. Mounting may take place using any standard surface mount technology production protocols. Instead of using conventional interconnect materials to promote mounting, interconnect 501, formed from fused copper nanoparticles, joins the two components together. The all-copper aspect of component interconnect 5 refers to a copper-based contact cap (not shown in FIG. 13) located upon electronic component 500, interconnect 501 formed from fused copper nanoparticles, and copper pads 502 located upon package substrate 403. Interconnect 501 may include a bulk copper matrix comprising at least 90% density nanocopper, which may be formed upon fusion of copper nanoparticles with diameter less than about 20 nm or less than about 70 nm. Copper pad 502 may be pure copper, or copper-based alloys, such as bronze, brass or cupronickel. The copper-based contact cap upon electronic component 500 may be formed from similar copper materials and have similar dimensions to copper pad 502. The total area covered by electronic component 500 may range from about 0.4×0.2 mm to about 7.4×5.1 mm, but more typically below about 3.8×3.8 mm. The dimensions of copper pad 502 and the copper-based contact cap may be dependent on the size of electronic component 500. For the largest electronic component 500 typically used (3.8×3.8 mm), the width of copper pad 502 or the copper-based contact cap is commonly about 1.27 mm to 1.52 mm. For the smallest electronic component 500 typically used, the width of copper pad 502 or the copper-based contact cap is commonly about 0.36 mm to 0.46 mm. It is to be appreciated, however, that these specifications for copper pad 502 and the copper-based contact cap may vary across manufacturers.

The assembly procedure for component interconnect 5 involves the application of a copper nanoparticle paste composition onto the location that becomes interconnect 501 and then heating the area to about 190-240° C. so that fusion of the copper nanoparticles occurs to form a bulk copper matrix comprising interconnect 501.

The assembly procedure for forming component interconnect 5 includes obtaining the following: electronic component 500 bearing a copper-based contact cap thereon, a copper nanoparticle paste composition in a sufficient amount to join electronic component 500 to package substrate 403, and package substrate 403 bearing copper pad 502. Connection to other electronic components, commonly a PCB, may occur through the procedures outlined above.

The copper nanoparticle paste composition can be applied directly onto copper pads 502 disposed upon package substrate 403. Application of the copper nanoparticle paste composition thereon may take place using a flat edge, such as a spatula, a doctor blade, or a similar structure. Electronic component 500 is then placed onto copper pads 502, and the copper nanoparticles are subsequently sintered to form an interconnect. Alternately, the copper nanoparticle paste composition may be applied to the copper-based contact cap upon electronic component 500 instead. In the former case, a thin stencil may be placed on package substrate 403, with apertures therein being positioned over copper pads 502. The copper nanoparticle paste composition is then spread on top of the stencil to apply unfused copper nanoparticles to the surface of copper pads 502. Once the stencil is removed, a layer of the copper nanoparticle paste composition remains on copper pads 502. Electronic component 500 can then be placed on package substrate 403, with copper contacts 501 of electronic component 500 being located on copper pads 502 of package substrate 403 with unfused copper nanoparticles intervening in between. Another method of applying copper nanoparticles to the copper-based contact cap or copper pads 502 can be through aerosol jet printing. In the case of aerosol jet printing (inkjet printing), the copper nanoparticle paste composition is dispensed onto the stencil or directly on electronic component 500 with a high-velocity aerosol stream.

There are a number of methods that can be employed to heat the resulting joint to the required temperature fusing the copper nanoparticles to form an interconnect between electronic component 500 and package substrate 403. In some embodiments, laser spot welding can be employed, in which a high-energy laser is directed at the joint, thereby heating a spot with diameter ranging from about 0.1 to 2.0 mm. This action causes the copper nanoparticles to undergo fusion, thereby creating an interconnect at the spot of laser incidence, wherein the interconnect comprises a bulk copper matrix that is contiguous with copper pads 501 upon electronic component 500 and copper pads 502 upon electronic component 403. If the spot is too small, the laser can then be directed to areas where the copper nanoparticles have not yet been fused, thereby ensuring that the joint is fully welded. In another variant, pulsed light photosintering can be used to heat the joint. In this process, the assembly is illuminated by high-energy peak pulses for milliseconds at a time. This action heats the copper nanoparticles rapidly up to at least the fusion temperature, thereby promoting fusion to form a solid interconnect comprising a bulk copper matrix.

In still another variant, the assembly can be moved into a reflow oven, where the temperature will uniformly increase, allowing fusion of the copper nanoparticles to occur, thereby forming a solid copper interconnect. The reflow oven may be operated at similar conditions to those noted above for other components. If the heating process causes nanoparticle fusion to occur over a matter of minutes, heating may be carried out in an inert atmosphere, like nitrogen gas, to prevent oxidation of the copper nanoparticles or the resulting bulk copper matrix formed during the heating process. The reflow heating procedure may be repeated many times. In this fashion, multi-stacking components and double-sided and/or multi-layered boards may be easily produced.

Through Hole Copper 6 (Via Copper)

Figure 14:
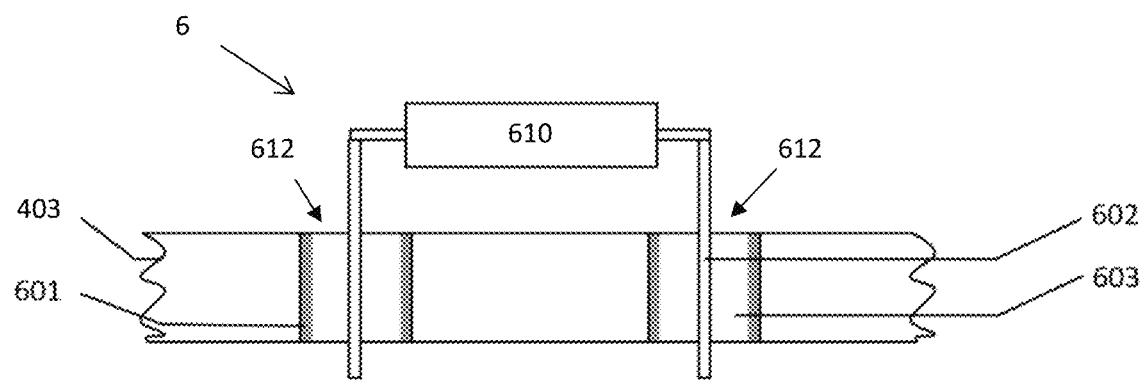
FIG. 14 shows a diagram of an illustrative configuration for through-hole copper (also referred to as via copper) in an electronic assembly, in which the through-hole copper is formed from fused copper nanoparticles.

FIG. 14 shows a diagram of an illustrative configuration for through-hole copper 6, also referred to as via copper 6, in which the through-hole copper is formed from fusion of copper nanoparticles. Via copper 6 is located in through hole via (THV) 612 extending through the plane of package substrate (PCB) 403, thereby allowing thermal and/or electronic communication between the two faces of package substrate 403 to take place. Although via copper 6 is shown extending to electronic component 610 that is not directly adjoined to package substrate 403, it is to be understood that via copper 6 may similarly extend to electronic component 500, which is bound to package substrate 403 by component interconnect 5.

Referring again to FIG. 14, copper plating may be present on barrel wall 601 of via 612 and/or component lead 602. Component lead 602 extends to electronic component 610 and may comprise copper or a copper alloy. Interconnect 603, formed from fused copper nanoparticles, joins component lead 602 to barrel wall 601. The all-copper aspect of via copper 6 refers to the copper plating on via barrel wall 601, component lead 602 formed from copper, and interconnect 603, formed from fused copper nanoparticles, joining the two components together (i.e., barrel wall 601 and component lead 602). Interconnect 603 may feature a bulk copper matrix comprising at least 90% density nanocopper, which may result from fusion of copper nanoparticles with diameters less than about 20 nm or less than about 70 nm. Component lead 602 can be made of copper, brass (C27000 or C27200 brass) or a similar copper alloy, depending on the design specifications of the system. The size (diameter) of via 612 and component lead 602 may vary greatly, depending on design specifications, but common gap/clearance values between component lead 602 and barrel wall 601 may range between about 0.2 to 0.5 mm.

The assembly procedure to form via copper 6 may include filling the area that becomes interconnect 603 with a copper nanoparticle paste composition and heating the area to promote fusion of the copper nanoparticles. The assembly procedure may further include obtaining electronic component 610 to perform a through-hole mount thereof, a sufficient amount of a copper nanoparticle paste composition to fill up the holes defining vias 612, and package substrate 403 containing vias 612 to place component leads 602 of electronic component 610 therein.

To ensure that the copper nanoparticle paste composition is tightly packed in vias 612, nanoparticle filling of the area that becomes interconnect 603 may be performed first before insertion of component leads 602 takes place. Filling may be performed by standard via filling methods, such as through use of an extrusion bladder filled with a copper nanoparticle paste composition placed at the entrance of via 612. In this procedure, package substrate 403 may be placed on a solid surface and pressure may be applied to prevent it from moving. Air pressure may then be applied on the extrusion bladder to extrude the paste composition into via 612. Package substrate 403 is then lifted off the surface, and component lead 602 of electronic component 610 may then be inserted into the copper nanoparticle paste composition, with copper nanoparticle fusion taking place thereafter. Another filling method may include direct injection of the copper nanoparticle paste composition into vias 612 using a syringe. To form a junction between via walls 601 and component leads 602, the assembly may be placed in a reflow oven and heated uniformly to a temperature of about 190-240° C. until the via fill becomes a solid plug comprising a bulk copper matrix. Additional details concerning via filling with copper nanoparticles can be found in commonly owned U.S. Provisional Patent Application 62/625,668, filed on Feb. 2, 2018 and entitled "Thermal Management in Circuit Board Assemblies," which is incorporated herein by reference in its entirety.

Heat Channel 7

Figure 15:
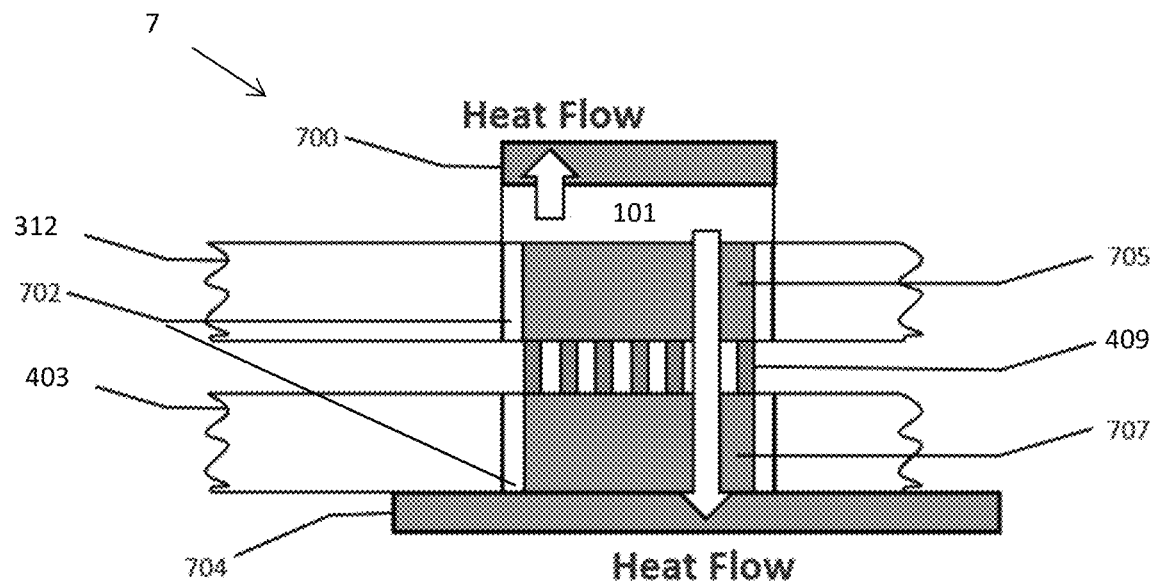
FIG. 15 shows a diagram of an illustrative heat channel in an electronic assembly, in which the heat channel is formed from fused copper nanoparticles.

FIG. 15 shows a diagram of an illustrative heat channel in an electronic assembly, in which the heat channel is formed from fused copper nanoparticles. Heat channel 7 defines a thermal dissipation system that can direct excess heat toward heat sinks 700 and 704 located upon opposing faces of electronic assembly 9. As depicted, upward heat flow and heat dissipation may be achieved by direct contact between heat sink 700 and electronic component 101, while the downward heat flow and heat dissipation from electronic component 101 may be achieved by directing heat through large through-hole vias 705 and 707, each filled with a bulk copper matrix formed from fused copper nanoparticles, and copper pillars 409 extending between IC substrate 312 and package substrate 403. Copper joint 405 may equivalently replace copper pillars 405. Copper joint 405/copper pillars 409 may represent a portion of those adjoining IC substrate 312 to package substrate 403 (FIGS. 5 and 6). Copper joint 405/copper pillars 409 may be formed in accordance with the description above for forming these structures in connector 4. A possible structural variant includes electronic component 101 being directly joined to heat sink 700 (as presently shown in FIG. 15), with IC substrate 312 and copper pillars 409 being removed to afford direct surface contact of electronic component 101 with the bulk copper matrix in via 707. In general, vias 705 and 707 in heat channel 7 are larger in diameter than are those in through-hole copper 6, since the former are employed for heat transfer whereas the latter are largely for promoting electronic communication between opposite sides of package substrate 403. Additional details concerning filling of large vias with copper nanoparticle paste compositions can be found in U.S. Provisional Patent Application 62/625,688, previously referenced above.

Through-hole vias 705 and 707 are filled with a bulk copper matrix formed through fusion of copper nanoparticles and are configured to promote thermal communication. Barrel walls 702 of vias 705 and 707 may be coated with a copper layer, thereby forming a copper-copper interface between the via fill (a copper nanoparticle paste composition) after copper nanoparticle fusion has taken place. The all-copper aspect of heat channel 7 refers to the copper layer on barrel walls 702 of vias 705 and 707, the bulk copper matrix formed through copper nanoparticle fusion within vias 705 and 707, and copper pillars 409 extending between vias 705 and 707. The resulting thermal conduit connects electronic component 101 to heat sink 704, thereby allowing heat sink 700 to dissipate excess heat from one face of electronic assembly 9 and heat sink 704 to dissipate excess heat from the opposite face of electronic assembly 9.

The bulk copper matrix within vias 705 and 707 may feature 90% density nanocopper, which may be formed from fusion of copper nanoparticles having a nanoparticle size less than about 20 nm or less than about 70 nm. The diameters of vias 705 and 707 may range from about 0.1 mm to about 5 cm. At higher via diameters, scaffolding or a similar supporting structure may be present within vias 705 and 707 to support and retain the large amount of copper nanoparticle paste composition within vias 705 and 707 prior to copper nanoparticle fusion. Copper wires or copper mesh formed therefrom may be used for the scaffolding, such that the amount of copper may be maintained as high as possible to promote maximum thermal conductivity. The copper plating upon barrel walls 702 of vias 705 and 707 may have an upper limit of about 3 mm thickness. For smaller via holes (e.g., vias 612 in FIG. 14), the copper plating thickness may be around 10% of the via diameter or less.

Heat sink 704 can be either a standard heat sink mounted on a copper plate, in which case a Cu—Cu interface may result from the connection between the bulk copper matrix in via 707 and the copper plate of heat sink 704. Heat sink 704 can also refer to a copper-based strip or connection that is able to transfer heat to a heat sink further away from electronic component 101. As such, heat sink 704 need not necessarily reside directly on package substrate 704. In both cases, the copper plate and/or copper-based strip (a thermal strap) can be made of pure copper or copper-based alloys like brass, bronze or cupronickel, as they may provide high thermal conductivity as well.

Assembly of heat channel 7 may include filling vias 705 and 707 with a copper nanoparticle paste composition, heating vias 705 and 707 to a temperature of about 190-240° C., joining heat sink 704 to the resulting thermal conduit, and heating heat sink 704 to about 190-240° C. to promote nanoparticle fusion and bonding the bulk copper matrix within via 707 to heat sink 704. A copper nanoparticle paste composition may be placed between heat sink 704 and via 707 to promote bonding between the two when reheating via 707. Copper pillars 409 or a similar structure connecting IC substrate 312 and package substrate 403 to each other may be fabricated by any of the techniques described hereinabove, such as those described for connector 4.

To prepare heat channel 7, the following may be obtained: a sufficient amount of a copper nanoparticle paste composition to fill vias 705 and 707, optionally copper wire or a copper mesh in the case that scaffolding is needed for support, one or more substrates having through a hole present for defining vias 705 and 707 therein, and a thermal conduit (copper plate or copper strip) to connect heat sink 704 to package substrate 403.

For thermal vias of sufficiently small diameter, extrusion filling of vias 705 and 707 with a copper nanoparticle paste composition may be carried out. The corresponding substrates bearing vias 705 and 707 may be placed on top of a stiff backing and held down with a vice or clamp so it will not move during filling. An extrusion bladder or injection syringe containing the copper nanoparticle paste composition may be held at the entrance of each via 705 and 707, and pressure is exerted on the bladder/syringe, such that the copper nanoparticle paste composition is extruded into each via 705/707. The substrate is then carefully removed from the backing.

Filling of thermal vias 705 and 707 can also be carried out by screen printing. A stencil drilled with matching via patterns may be placed onto the substrate. Another backup stencil with the same matching via pattern may be placed behind the substrate (i.e., opposite the other stencil). The copper nanoparticle paste composition is then dispensed onto the substrate using a squeegee or similar structure until a nail head amount of the paste composition appears on the other side of backup stencil. This ensures that the via protrusion is uniform on both sides. Both stencils are then carefully removed from the substrate, with further processing taking place thereafter.

For thermal vias 705 and 707 of larger diameters another procedure may be added to either of the filling methods above. Before beginning either of the above methods, a copper wire mesh may be fabricated that can be fit snugly into each via 705 and 707. This ensures that the copper nanoparticle paste composition is well supported, and will not exit vias 705 and 707 due to a lack of structural support.

After filling is complete, the substrate containing the filled via is placed in a reflow oven and slowly heated until the via temperature reaches about 190-240° C., thereby forming a plug comprising a bulk copper matrix upon fusing the copper nanoparticles together. Nanoparticle fusion may take place for about 5 or 10 minutes up to about an hour, until the copper nanoparticles have sufficiently fused to form a solid copper through-hole plug. The fusion process can be performed in an inert environment, such as with nitrogen gas, to prevent oxidation of nanocopper particles or the resulting bulk copper matrix formed during fusion. Nanoparticle fusion may be performed in vacuum as well.

The production methods may also include placing a copper ribbon wire/strip on package substrate 403, in which case heat sink 704 may be placed on the other end of the copper ribbon wire/strip. The copper ribbon wire/strip may create a thermal conduit from the thermal plug in via 707 to heat sink 704. Thus, heat sink 704 may be laterally offset from via 707 in some instances. Moreover, heat sink 704 need not necessarily even reside upon package substrate 403. To attach the copper ribbon wire/strip to the thermal plug, two methods can be used. In one approach, the copper ribbon wire/strip can be dipped into a container of copper nanoparticle paste composition before undergoing joining with the thermal plug. Fusion of the copper nanoparticles may form a copper-copper bond with the thermal plug. In another approach, the copper nanoparticle paste composition can also be directly applied to the copper ribbon wire/strip through use of a flat edge like a spatula or a doctor blade.

There are multiple ways to achieve nanoparticle fusion. First, the entire assembly can be placed into a reflow oven and heated uniformly until the temperature within vias 705 and 707 reaches about 190-240° C., thereby allowing the copper nanoparticles to undergo fusion to form a bulk copper matrix. If this method is used, before the copper nanoparticle paste composition undergoes heating, a copper ribbon wire/strip can be placed in contact with the copper nanoparticle paste composition within via 707 at the face of package substrate 403. The whole assembly can then be heated up together. In another approach, heat can be applied to the copper nanoparticle paste composition within each via using laser spot welding. A high-energy laser is directed at the copper nanoparticle paste composition to heat a spot with diameter ranging from about 0.1 to 2.0 mm. This action promotes copper nanoparticle fusion at the spot, thereby creating a solid interconnect comprising a bulk copper matrix at the spot. The laser can then be directed to areas where the copper nanoparticles have not yet fused, ensuring that the joint is fully welded. If used, a copper ribbon wire/strip can be placed at or near the spot of laser incidence upon the copper nanoparticle paste composition.

It is also to be appreciated that the principles described hereinabove may be extended to three-dimensional integrated circuits as well. Such three-dimensional integrated circuits may have multiple chips or dies stacked upon one another and interconnected with a bulk copper matrix formed from fused copper nanoparticles. Such a structure is described hereinafter in reference to FIG. 16.

FIG. 16 shows a diagram of an illustrative three-dimensional integrated circuit 8 (3DIC) employing a heat channel formed from fused copper nanoparticles. Integrated circuit 8 includes a plurality of silicon wafers or dies 800,802,804 that are stacked vertically and interconnected with interconnects 801,803,805 formed from fused copper nanoparticles. Interconnects 801,803,805 are sandwiched in between dies 800,802,804, respectively, and are in thermal communication with one another through thermal vias 808, 809 extending through dies 802, 804, respectively. Dies 800,802,804 may comprise a silicon-based chip, for example. Interconnects 801,803,805 and thermal vias 808,809, similar to those described above in reference to FIG. 16, may comprise a bulk copper matrix formed from fused copper nanoparticles. Heat sinks (not shown in FIG. 16) may be in contact with die 800 and package substrate 403, in a manner similar to that described above in reference to FIG. 15. Similarly, thermal vias similar to those described in reference to FIG. 15 are not shown in FIG. 16 but may extend through IC substrate 312 and package substrate 403 to promote thermal conduction to the heat sinks. Thus, interconnects 801,803,805 may collectively promote heat dissipation from three-dimensional integrated circuit 8 in combination with heat sinks similar to heat sinks 700 and 704 (FIG. 15) and vias similar to vias 705 and 707 (FIG. 15).

With the application of through-die fused copper nanoparticles, the number of stacked silicon wafers/dies can be extended to an almost unlimited height. Thus, the depicted three dies 800,802,804 in FIG. 16 should not be considered limiting of the concepts disclosed herein. Copper pillars 409 or a similar structure, also potentially formed from fused copper nanoparticles, may also be present between IC substrate 312 and package substrate 403, as discussed in more detail above. Any of the above structures may comprise a bulk copper matrix formed from fused copper nanoparticles with a diameter less than about 20 nm or less than about 70 nm.

To avoid a chip area penalty, the pitch of thermal vias 808,809 may be limited to about 5 microns or under. This also means that the bulk copper matrix therein may be limited to the same size. Thermal vias 808 and 809 are not placed in contact with each other but are in indirect thermal contact through interconnect 803.

Vias 808,809 in integrated circuit 8 may be formed and filled with a copper nanoparticle paste composition by the process described hereinafter. Dies 800,802,804 may be etched vertically using a photoresist to create vias 808,809. Suitable etching techniques will be familiar to one having ordinary skill in the art. Typical dimensions of vias 808,809 may range between about 5 to 150 μm for the diameter and about 20 to 200 μm for the length through-plane. A dielectric layer may be deposited onto the via walls to promote electrical isolation of the via hole from the surrounding silicon chip. $SiO_2$ or $Si_3N_4$ may constitute a suitable dielectric layer, either of which may be deposited by plasma-enhanced chemical vapor deposition (PECVD) or sub-atmospheric chemical vapor deposition (SACVD) if the via diameter is sufficiently large. When via diameter is smaller than about 3 μm, the dielectric layer may be suitably deposited by atomic layer deposition (ALD). A barrier layer may then be deposited onto the dielectric layer to prevent diffusion of copper atoms from the copper-filled via later on. Common materials for incorporation in the barrier layer include Ti, Ta, TiN, and TaN. Physical vapor deposition (PVD), CVD, and ALD are among the suitable methods for depositing the barrier layer, depending upon the via diameter. Finally, a copper nanoparticle paste composition is deposited into vias 808 and 809, and the assembly is then heated at a temperature of about 190-240° C. for a predetermined time to cause the copper nanoparticles to undergo solid-state sintering and solidification to form a bulk copper matrix.

The next step for forming integrated circuit 8 involves stacking of dies 800,802,804 using interconnects 801,803, 805 similar to those described above in more detail in reference to connection 4. To promote heat transfer through stacked dies 800,802,804, vias 808,809 may be aligned with one another and with interconnects 803 following stacking. Aligned stacking affords a continuous heat transfer pathway from die 800 sequentially through interconnect 801, via 808, interconnect 803, via 809, and interconnect 805. Further thermal vias formed from copper nanoparticles may extend through IC substrate 312 and package substrate 403 for heat dissipation through a backside heat sink.

Heating to a temperature of about 190-240° C. may take place every time an additional die is stacked above another to solidify an additional interconnect formed thereon through fusion of copper nanoparticles. That is, formation of each interconnect may take place with copper nanoparticle fusion before stacking a subsequent die. Outermost die 800 does not contain a via extending therethrough. Given that the fused copper nanoparticles comprise a bulk copper matrix having a melting temperature of about 1084° C. after each nanoparticle fusion operation, sequential heat treatment at a temperature of 190-240° C. after stacking of each die does not cause melting of the existing bulk copper matrices between interior layers. As such, multiple dies may be stacked sequentially with nanoparticle fusion taking place after stacking of each die.

Alternately, the entire assembly comprising multiple silicon dies stacked upon one another may be assembled and heated to promote copper nanoparticle fusion between each of the layers at the same time. Thus, in an assembly process variant, stacking may take place with the copper nanoparticle paste composition in vias 808 and 809 and interconnects 801,803,805 still in paste form (unfused). The assembly can be supported by a temporary heat-resistant scaffold to ensure proper alignment and contact is maintained prior to nanoparticle fusion. In this case, a single application of heat may consolidate the copper nanoparticle paste composition within each via and each interconnect.

Unless otherwise indicated, all numbers expressing quantities of ingredients, properties such as molecular weight, reaction conditions, and so forth used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the embodiments of the present invention. At the very least, and not as an attempt to limit the application of the doctrine of equivalents to the scope of the claim, each numerical parameter should at least be construed in light of the number of reported significant digits and by applying ordinary rounding techniques.

Accordingly, the present disclosure describes multiple types of copper interconnects that may be formed through fusion of copper nanoparticles within an electronic assembly. The copper interconnects may serve any purpose including structural/mechanical joining, electrical communication, thermal communication, or any combination thereof. A particular copper interconnect may similarly serve multiple purposes from among those listed above.

Electronic assemblies described herein may comprise copper interconnects in multiple locations. The copper interconnects may be of a single type of different types. Electronic assemblies may comprise a single type of copper interconnect, two or more types of copper interconnects, three or more types of copper interconnects, and so on. A given electronic assembly may comprise a copper interconnect selected from among a copper-based wire bonding assembly, a copper-based flip chip connection, a copper-based hermetic seal assembly, a copper-based connector between an IC substrate and a package substrate, a copper-based component interconnect, a copper-based interconnect comprising via copper for establishing electrical communication between opposite faces of a package substrate, a copper-based interconnect defining a heat channel formed from larger-diameter via copper, and any combination thereof. Certain copper interconnects may incorporate elements from other copper interconnects. As a non-limiting example, copper pillars promoting bonding between an IC substrate and a package substrate may also be incorporated in a copper-based heat channel for promoting thermal communication in opposite directions in an electronic assembly.

Embodiments Disclosed Herein Include Those of the Following Clauses:

Clause 1. An electronic assembly comprising multiple components fabricated from copper nanoparticles, as described herein.

Clause 2. The electronic assembly of clause 1, wherein the electronic assembly is an all-copper electronic assembly.

Clause 3. The electronic assembly of clause 1 or clause 2, wherein the electronic assembly lacks a conventional solder.

Clause 4. A method for fabricating an electronic assembly, comprising: fabricating multiple components of the electronic assembly from copper nanoparticles, as described herein.

Clause 5. The method of clause 4, wherein the electronic assembly lacks a conventional solder.

Clause 6. The method of clause 4 or clause 5, wherein the electronic assembly is an all-copper electronic assembly Additional Embodiments Disclosed Herein Include:

A. Electronic assemblies having copper interconnects. The electronic assemblies comprise: a package substrate; and a plurality of interconnects of different types in direct or indirect contact with the package substrate; wherein each interconnect or a portion thereof comprises a bulk copper matrix formed from fusion of copper nanoparticles or a reaction product formed from copper nanoparticles.

B. Electronic assemblies having two or more copper interconnects of different types. The electronic assemblies comprise: a package substrate; and two or more copper interconnects of different types in direct or indirect contact with the package substrate, each copper interconnect or a portion thereof comprising a bulk copper matrix formed from fusion of copper nanoparticles or a reaction product formed from copper nanoparticles.

C. Electronic assemblies comprising a flip chip connection formed from copper nanoparticles. The electronic assemblies comprise: a flip chip connection, the flip chip connection comprising: an IC substrate containing a plurality of under bump metallization (UMB) contacts disposed thereon, each UBM contact comprising copper; a package substrate containing a plurality of copper pads disposed thereon; and at least one copper-based interconnect or a portion thereof formed from fused copper nanoparticles and connecting the IC substrate to the package substrate, the at least one copper-based interconnect being disposed upon the UBM contacts and the copper pads.

D. Electronic assemblies comprising a hermetic seal assembly formed from fused copper nanoparticles. The electronic assemblies comprise: an IC substrate; an electronic component disposed on the IC substrate; and a hermetic seal assembly surrounding the electronic component, the hermetic seal assembly comprising a hermetic seal lid disposed over the electronic component and a bonding surface contacting the IC substrate; wherein a nanocopper seal comprising a bulk copper matrix formed from fused copper nanoparticles connects the bonding surface to the IC substrate.

E. Electronic assemblies comprising a heat channel formed from fused copper nanoparticles. The electronic assemblies comprise: an IC substrate; a package substrate; an electronic component disposed upon the package substrate; and a heat channel extending through the IC substrate and the package substrate and establishing thermal communication with the electronic component; wherein the IC substrate has a first thermal via defined therein and the package substrate has a second thermal via defined therein, each thermal via being filled with a bulk copper matrix formed from fused copper nanoparticles; wherein the bulk copper matrices are further interconnected with a plurality of copper-based interconnects extending between the IC substrate and the package substrate, each copper-based interconnect also comprising a bulk copper matrix formed from fused copper nanoparticles.

Embodiments A-E May have One or More of the Following Additional Elements in any Combination:

Element 1: wherein the plurality of interconnects comprises multiple interconnects selected from the group consisting of a copper-based wire bonding assembly, a copper-based flip chip connection, a copper-based hermetic seal assembly, a copper-based connector between an IC substrate and the package substrate, a copper-based component interconnect, a copper-based interconnect comprising via copper for establishing electrical communication between opposite faces of the package substrate, a copper-based interconnect defining a heat channel formed from via copper, and any combination thereof.

Element 2: wherein there are no interconnects of any type lacking copper in direct or indirect contact with the package substrate.

Element 3: wherein the plurality of interconnects comprises at least one of a copper-based flip chip connection, a copper-based hermetic seal assembly, or a copper-based connector between an IC substrate and the package substrate.

Element 4: wherein the plurality of interconnects further comprises at least one of a copper-based wire bonding assembly, a copper-based component interconnect, a copper-based interconnect comprising via copper for establishing electrical communication between opposite faces of the package substrate, or a copper-based interconnect defining a heat channel formed from via copper.

Element 5: wherein the two or more copper interconnects are selected from the group consisting of a copper-based wire bonding assembly, a copper-based flip chip connection, a copper-based hermetic seal assembly, a copper-based connector between an IC substrate and the package substrate, a copper-based component interconnect, a copper-based interconnect comprising via copper for establishing electrical communication between opposite faces of the package substrate, a copper-based interconnect defining a heat channel formed from via copper, and any combination thereof.

Element 6: wherein the two or more copper interconnects comprise at least one copper interconnect selected from the group consisting of a copper-based flip chip connection, a copper-based hermetic seal assembly, a copper-based connector between an IC substrate and the package substrate, and any combination thereof.

Element 7: wherein the two or more interconnects comprise at least one of the following combinations of copper interconnects: a copper-based wire bonding assembly and a copper-based flip chip connection, a copper-based wire bonding assembly and a copper-based hermetic seal assembly, a copper-based wire bonding assembly and a copper-based connector between an IC substrate and the package substrate, a copper-based wire bonding assembly and a copper-based component interconnect, a copper-based wire bonding assembly and a copper-based interconnect comprising via copper for establishing electrical communication between opposite faces of the package substrate, a copper-based wire bonding assembly and a copper-based interconnect defining a heat channel formed from via copper, a copper-based flip chip connection and a copper-based hermetic seal assembly, a copper-based flip chip connection and a copper-based connector between an IC substrate and the package substrate, a copper-based flip chip connection and a copper-based component interconnect, a copper-based flip chip connection and a copper-based interconnect comprising via copper for establishing electrical communication between opposite faces of the package substrate, a copper-based flip chip connection and a copper-based interconnect defining a heat channel formed from via copper, a copper-based hermetic seal assembly and a copper-based connector between an IC substrate and the package substrate, a copper-based hermetic seal assembly and a copper-based component interconnect, a copper-based hermetic seal assembly and a copper-based interconnect comprising via copper for establishing electrical communication between opposite faces of the package substrate, a copper-based hermetic seal assembly and a copper-based interconnect defining a heat channel formed from via copper, a copper-based component interconnect and a copper-based interconnect comprising via copper for establishing electrical communication between opposite faces of the package substrate, a copper-based component interconnect and a copper-based interconnect defining a heat channel formed from via copper, and a copper-based interconnect comprising via copper for establishing electrical communication between opposite faces of the package substrate and a copper-based interconnect defining a heat channel formed from via copper.

Element 8: further comprising at least one additional copper interconnect of a different type.

Element 9: wherein the two or more copper interconnects of different types are disposed between silicon dies of a three-dimensional integrated circuit.

Element 10: wherein the at least one copper-based interconnect comprises a spherical copper joint or a copper pillar.

Element 11: wherein the electronic assembly further comprises a heat sink in thermal communication with the hermetic seal lid.

Element 12: wherein a first thermal interface material is interposed between the electronic component and the hermetic seal lid and a second thermal interface material is interposed between the hermetic seal lid and the heat sink.

Element 13: wherein the first and second thermal interface materials comprise a bulk copper matrix formed from fused copper nanoparticle or a reaction product of copper nanoparticles.

Element 14: wherein the first and second thermal interface materials comprise a compliant substance comprising a reaction product of copper nanoparticles.

Element 15: wherein the electronic assembly further comprises a first heat sink in thermal communication with a face of the electronic component opposite the IC substrate; and a second heat sink in thermal communication with the second thermal via of the heat channel.

Element 16: wherein the first heat sink is connected to the electronic assembly with a first copper-based interconnect comprising a bulk copper matrix formed from copper nanoparticles and the second heat sink is connected to the second thermal via with a second copper-based interconnect comprising a bulk copper matrix formed from copper nanoparticles.

By way of non-limiting example, exemplary combinations applicable to A include 1 and 2; 1 and 3; 2 and 3; 2-4; and 3 and 4. Exemplary combinations applicable to B include 5 and 7; 6 and 9; 7 and 9; 7 and 8; and 7 and 9. Exemplary combinations applicable to D include 11 and 12; 11-13; and 11-14. Exemplary combinations applicable to E include 15 and 16.

One or more illustrative embodiments incorporating the features of the present disclosure are presented herein. Not all features of a physical implementation are described or shown in this application for the sake of clarity. It is understood that in the development of a physical embodiment incorporating the present disclosure, numerous implementation-specific decisions must be made to achieve the developer's goals, such as compliance with system-related, business-related, government-related and other constraints, which vary by implementation and from time to time. While a developer's efforts might be time-consuming, such efforts would be, nevertheless, a routine undertaking for those of ordinary skill in the art and having benefit of this disclosure.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. The disclosure herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

The invention claimed is:

1. An electronic assembly comprising:
a package substrate;
an IC substrate interconnected to the package substrate; and
a plurality of interconnects in direct or indirect contact with the package substrate, the plurality of interconnects comprising two or more different types of interconnects having types selected from the group consisting of a copper-based wire bonding assembly, a copper-based flip chip connection to the IC substrate, a copper-based hermetic seal assembly connected to the IC substrate, a copper-based connector between the IC substrate and the package substrate, a copper-based component interconnect to a backside of the package substrate, a copper-based interconnect comprising via copper for establishing electrical communication between opposite faces of the package substrate, a copper-based interconnect defining a heat channel formed from via copper, and any combination thereof;
wherein each interconnect or a portion thereof comprises a bulk copper matrix formed from fusion of copper nanoparticles or a reaction product formed from copper nanoparticles.

2. The electronic assembly of claim 1, wherein there are no interconnects of any type lacking copper in direct or indirect contact with the package substrate.

3. The electronic assembly of claim 1,
wherein the plurality of interconnects comprises at least one type selected from the group consisting of the copper-based flip chip connection to the IC substrate, the copper-based hermetic seal assembly connected to the IC substrate, and the copper-based connector between the IC substrate and the package substrate.

4. The electronic assembly of claim 3, wherein the plurality of interconnects further comprises at least one of the copper-based wire bonding assembly, the copper-based component interconnect to a backside of the package substrate, the copper-based interconnect comprising via copper for establishing electrical communication between opposite faces of the package substrate, or the copper-based interconnect defining a heat channel formed from via copper.

5. The electronic assembly of claim 1, wherein the plurality of interconnects are disposed between silicon dies of a three-dimensional integrated circuit.

6. An electronic assembly comprising:
an IC substrate;
an electronic component disposed on the IC substrate; and
a hermetic seal assembly surrounding the electronic component, the hermetic seal assembly comprising a hermetic seal lid disposed over the electronic component and being interconnected to the IC substrate, the hermetic seal lid being formed from bulk copper or a copper alloy and comprising a generally horizontal surface disposed over the electronic component, a non-horizontal surface surrounding sides of the electronic component, and a mounting surface contiguous with the non-horizontal surface, the mounting surface contacting the IC substrate;
wherein a nanocopper seal comprising a bulk copper matrix formed from fused copper nanoparticles connects the mounting surface to the IC substrate.

7. The electronic assembly of claim 6, further comprising:
a heat sink in thermal communication with the hermetic seal lid.

8. The electronic assembly of claim 7, wherein a first thermal interface material is interposed between the electronic component and the hermetic seal lid and a second thermal interface material is interposed between the hermetic seal lid and the heat sink.

9. The electronic assembly of claim 8, wherein the first and second thermal interface materials each comprise a bulk copper matrix formed from fused copper nanoparticles or a reaction product of copper nanoparticles.

10. The electronic assembly of claim 8, wherein the first and second thermal interface materials each comprise a compliant substance comprising a reaction product of copper nanoparticles.

11. An electronic assembly comprising:
an IC substrate;
a package substrate;
an electronic component disposed upon the package substrate; and
a heat channel extending through the IC substrate and the package substrate and establishing thermal communication with the electronic component;
wherein the IC substrate has a first thermal via extending therethrough and the package substrate has a second thermal via extending therethrough, each thermal via being filled with a bulk copper matrix formed from fused copper nanoparticles;
wherein the bulk copper matrices within the first thermal via and the second thermal via are further interconnected with a plurality of copper-based interconnects extending between the IC substrate and the package substrate, each copper-based interconnect also comprising a bulk copper matrix formed from fused copper nanoparticles.

12. The electronic assembly of claim 11, further comprising:
a first heat sink in thermal communication with a face of the electronic component opposite the IC substrate; and
a second heat sink in thermal communication with the second thermal via of the heat channel.

13. The electronic assembly of claim 12, wherein the first heat sink is connected to the electronic assembly with a first bulk copper matrix formed from copper nanoparticles and the second heat sink is connected to the second thermal via with a second bulk copper matrix formed from copper nanoparticles, the first bulk copper matrix being disposed between the first heat sink and the electronic assembly and the second bulk copper matrix being disposed between the second heat sink and the second thermal via of the package substrate.

* * * * *